(12) United States Patent
Lim et al.

(10) Patent No.: US 10,534,021 B2
(45) Date of Patent: Jan. 14, 2020

(54) HARMONIC HALL VOLTAGE ANALYSIS METHOD

(71) Applicant: KOREA UNIVERSITY RESEARCH AND BUSINESS FOUNDATION, Seoul (KR)

(72) Inventors: Sang Ho Lim, Namyangju-si (KR); Seok Jin Yun, Guri-si (KR); Kyung-Jin Lee, Seoul (KR); Eun-Sang Park, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 303 days.

(21) Appl. No.: 15/680,839

(22) Filed: Aug. 18, 2017

(65) Prior Publication Data

US 2018/0210015 A1 Jul. 26, 2018

(30) Foreign Application Priority Data

Jan. 26, 2017 (KR) .................. 10-2017-0012395

(51) Int. Cl.
*G01R 15/20* (2006.01)
*G01R 19/25* (2006.01)
(Continued)

(52) U.S. Cl.
CPC ....... *G01R 15/202* (2013.01); *G01R 19/2506* (2013.01); *G01R 33/0029* (2013.01); *G01R 33/07* (2013.01)

(58) Field of Classification Search
CPC .............. G01R 15/202; G01R 19/2506; G01R 33/0029; G01R 33/07; G01R 19/2513; G06N 20/00
(Continued)

(56) References Cited

U.S. PATENT DOCUMENTS

| 4,442,386 A | * | 4/1984 | Uchida | ..................... H02P 6/00 |
| | | | | 318/400.03 |
| 4,692,703 A | | 9/1987 | Extance et al. | |

(Continued)

FOREIGN PATENT DOCUMENTS

| EP | 3355074 B1 | 10/2019 |
| JP | S60-194379 | 10/1985 |

(Continued)

OTHER PUBLICATIONS

Garello, K. et al., "Symmetry and magnitude of spin-orbit torques in ferromagnetic heterostructures," Nature Nanotechnology, Jul. 2013, pp. 587-593 (Year: 2013).*

(Continued)

*Primary Examiner* — John E Breene
*Assistant Examiner* — Jeffrey P Aiello
(74) *Attorney, Agent, or Firm* — Jenkins, Wilson, Taylor & Hunt, P.A.

(57) ABSTRACT

A harmonic Hall voltage analysis method is provided to analyze a damping-like effective field $\Delta H_{DL}$ and a field-like effective field $\Delta H_{FL}$ with respect to polar angles of all magnetizations and a ratio R of an anomalous Hall effect resistance $R_{AHE}$ to a wide plane Hall resistance $R_{PHE}$ ($R=R_{AHE}/R_{PHE}$).

6 Claims, 13 Drawing Sheets

(51) Int. Cl.
*G01R 33/00* (2006.01)
*G01R 33/07* (2006.01)

(58) Field of Classification Search
USPC ......... 257/E43.003; 324/117, 117 H, 117 R, 324/207.2, 207.12, 252; 327/511; 338/32; 702/65, 151, 188
See application file for complete search history.

(56) References Cited

U.S. PATENT DOCUMENTS

| | | | |
|---|---|---|---|
| 10,005,129 B2 | 6/2018 | Zahiri et al. | |
| 2004/0075407 A1 | 4/2004 | Ohiwa et al. | |
| 2006/0176620 A1* | 8/2006 | Ravelosona | G11B 5/193 360/324.2 |
| 2012/0200288 A1 | 8/2012 | Jung et al. | |
| 2014/0070796 A1* | 3/2014 | Reymond | G01D 5/145 324/207.2 |
| 2015/0345669 A1 | 12/2015 | Zahiri et al. | |
| 2016/0274199 A1* | 9/2016 | Gopman, IV | G01R 33/16 |
| 2017/0316813 A1 | 11/2017 | Lee et al. | |
| 2018/0301177 A1* | 10/2018 | Nakatsuji | G11C 11/15 |

FOREIGN PATENT DOCUMENTS

| | | |
|---|---|---|
| JP | 6393809 B2 | 9/2018 |
| KR | 2002-0043439 A | 6/2002 |
| KR | 100937504 B1 | 1/2010 |
| KR | 10-2012-0009691 A | 2/2012 |
| WO | WO 2016/182354 A1 | 11/2016 |

OTHER PUBLICATIONS

Hayashi et al., "Quantitative characterization of spin-orbit torque using harmonic Hall voltage measurements," Physical Review B, American Physical Society, vol. 89, Issue 14, pp. 144425-1-144425-14 (Apr. 29, 2014).

Japanese Notice of Allowance for Application No. JP 2017-157015 dated Aug. 7, 2018.

Garello et al., "Symmetry and magnitude of spin-orbit torques in ferromagnetic heterostructures," Nature Nanotechnology, pp. 1-7, DOI: 10.1038/nnano.2013.145, published online Jul. 28, 2013.

Shaw et al., "Perpendicular Magnetic Anisotropy and Easy Cone State in Ta/Co60Fe20B20 /MgO," IEEE Magnetics Letters, vol. 6, pp. 1-4, DOI: 10.1109/LMAG.2015.2438773, dated Jul. 8, 2015.

Korean Office Action for Application No. 10-2017-0012395 dated Nov. 20, 2017.

Extended European Search Report for Application No. 17001363.5 dated Apr. 3, 2018.

Korean Grant of Patent for Application No. 10-2017-0012395 dated May 31, 2018.

* cited by examiner

HARMONIC HALL VOLTAGE ANALYSIS METHOD

CROSS-REFERENCE TO RELATED APPLICATIONS

This U.S. non-provisional patent application claims priority under 35 U.S.C. § 119 to Korean Patent Application No. 10-2017-0012395, filed on Jan. 26, 2017, in the Korean Intellectual Property Office, the entire contents of which are incorporated by reference herein.

TECHNICAL FIELD

The present disclosure relates to harmonic hall voltage analysis methods and, more particularly, to a harmonic hall voltage analysis method considering both a z-component of a magnetic field and second-order perpendicular magnetic anisotropy.

BACKGROUND

In a non-magnet (NM)/ferromagnet (FM) double layer nanostructure, in-plane current of an NM layer may generate a torque known as a spin orbit torque (SOT) that is enough to reverse magnetization at an FM layer. Many studies have been made to confirm that main mechanism of the SOT is one of spin hall effect (SHE) of an NM layer and NM/FM interface spin-orbit coupling (ISOC). In a system in which an NM/FM interface is perpendicular to z-axis and in-plane current flows along x-axis, spin current polarized along y-axis is generated based on spin Hall effect induced by bulk spin orbit coupling at a non-magnetic layer. The spin current is injected into an adjacent FM layer to transfer a torque to magnetization of the FM layer. A spin orbit torque (SOT) induced by the spin Hall effect generates a strong damping-like torque ($T_{DL} \propto m \times m \times y$) but generates a weak field-like torque ($T_{FL} \propto m \times y$). Theoretically, it has been known that the strength of SHE-induced SOT is independent of a magnetization direction of the FM layer. In the case of ISOC-induced SOT, a spin polarized along y-axis is accumulated at the NM/FM interface by broken inversion symmetry. Direct exchange coupling between magnetization of the FM layer and the accumulated spin generates a strong field-like torque $T_{FL}$ but generates a weak damping-like torque $T_{DL}$.

It is known that unlike a strength of the SHE-induced SOT, a strength of the SOC-induced SOT is dependent on a magnetization direction of the FM layer. In the two cases, the SHE and the ISOC qualitatively induces the same torque on the FM layer. To confirm a dominant mechanism of SOT, a damping-like torque TDL and a field-like torque TFL should be quantitatively analyzed for a wide-range magnetization angle.

A harmonic hall voltage measurement method is one of the methods useful in quantizing the effective field of $T_{DL}$ and $T_{FL}$ originated from SOT. This method is especially suitable to identify angle dependency on vertical magnetization of SOT applied to an FM layer. Several revisions including planar Hall effect (PHE), an out-of-plane component of an external magnetic field, and anomalous Nernst effect (ANE) are required to accurately analyze a measurement result. In measurement of a harmonic Hall voltage, a second harmonic resistance $R^{2\omega}$ includes two main components of anomalous and planar Hall magnetic resistances (represented by $R_{AHE}$ and $R_{PH}$, respectively). When an external magnetic field $H_{ext}$ is applied in a longitudinal direction (x), $R^{2\omega}$ values caused by AHE and PHE are in proportion to $T_{DL}$ and $T_{FL}$, respectively. However, while a transverse (y) $H_{ext}$ is applied, the $R^{2\omega}$ values caused by AHE and PHE are in proportion to $T_{FL}$ and $T_{DL}$, respectively. To this end, use of an analytical expression based on Cramer's rule is needed to separate $T_{FL}$ and $T_{DL}$ from each other. The analytical expression was successful only in a system having $R_{PHE} < R_{AHE}$. In the case of a system having $R_{PHE} > R_{AHE}$ such as triple-layer structure of W/CoFeB/MgO, divergence occurs in an analytical expression to make it very difficult to analyze a measurement result.

SUMMARY

A feature of the present disclosure is to analyze a damping-like effective field $\Delta H_{DL}$ and a field-like effective field $\Delta H_{FL}$ for polar angles of all magnetizations and a ratio R of an anomalous Hall effect resistance $R_{AHE}$ to a wide planar Hall resistance $R_{PHE}$ ($R = R_{AHE}/R_{PHE}$).

A harmonic Hall voltage analysis method according to an example embodiment of the present disclosure includes: measuring a first Hall voltage signal Vx while applying in-plane alternating current (AC) of a sine wave having a basic angular frequency ω in a first direction (x direction) in which a sample including a nonmagnetic layer/magnetic layer extends according to a first external magnetic field $H_{ext,xz}$; measuring a second Hall voltage signal Vy while applying the in-plane AC of the sine wave having the basic angular frequency ω in the first direction (x direction) in which the sample extends according to a second external magnetic field $H_{ext,yz}$; measuring a third Hall voltage signal Vxy while applying the in-plane AC of the sine wave having the basic angular frequency ω in the first direction (x direction) in which the sample extends according to a third external magnetic field $H_{ext,xy}$; extracting a first harmonic Hall resistance component $R^{1\omega}_x$ of the first external magnetic field $H_{ext,xz}$ and a second harmonic Hall resistance component $R^{2\omega}_x$ of the first external magnetic field $H_{ext,xz}$ by using the first Hall voltage signal Vx; extracting a first harmonic Hall resistance component $R^{1\omega}_y$ of the second external magnetic field $H_{ext,yz}$ and a second harmonic Hall resistance component $R^{2\omega}_y$ of the second external magnetic field $H_{ext,yz}$ by using the second Hall voltage signal Vy; extracting a first harmonic Hall resistance component $R^{1\omega}_{xy}$ of the third external magnetic field $H_{ext,xy}$ by using the second Hall voltage signal Vxy; extracting an anomalous Hall effect resistance $R_{AHE}$ by using the first harmonic Hall resistance component $R^{1\omega}_x$ of the first external magnetic field $H_{ext,xz}$ according to the first external magnetic field $H_{ext,xz}$ or the first harmonic Hall resistance component $R^{1\omega}_y$ of the second external magnetic field $H_{ext,yz}$ according to the second external magnetic field $H_{ext,yz}$; extracting a planar Hall resistance $R_{PHE}$ by using the first harmonic Hall resistance component $R^{1\omega}_{xy}$ of the third external magnetic field $H_{ext,xy}$; extracting a first resistance ratio ($G_x = 2R^{2\omega}_x/R_{ADF}$) of the second harmonic Hall resistance component $R^{2\omega}_x$ of the first external magnetic field $H_{ext,xz}$ to the anomalous Hall effect resistance $R_{AHE}$ and a second resistance ratio ($G_y = -2R^{2\omega}_y/R^{1\omega}_y$) of the second harmonic Hall resistance component $R^{2\omega}_y$ of the second external magnetic field $H_{ext,yz}$ to the first harmonic Hall resistance component $R^{1\omega}_y$ of the second external magnetic field $H_{ext,yz}$, respectively; and converting the first resistance ratio $G_x$ and the second resistance ratio $G_y$ into a damping-like effective field $\Delta H_{DL}$ and a field-like effective field $\Delta H_{FL}$. The first external magnetic field $H_{ext,xz}$ may maintain a constant direction in an xy plane defined by the first direction and a third direction perpendicular to a disposition plane and may vary in magnitude.

The second external magnetic field $H_{ext,yz}$ may have the same maximum magnitude as the first external magnetic field $H_{ext,xz}$, may maintain a constant direction in a yz plane defined by the second direction and the third direction perpendicular to the disposition plane, and may vary in magnitude. The third external magnetic field $H_{ext,xy}$ may maintain a constant magnitude on the disposition plane and may vary in direction.

BRIEF DESCRIPTION OF THE DRAWINGS

The present disclosure will become more apparent in view of the attached example drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

FIG. 8 includes (d) to (f) which show a result of the macro-spin simulation at $\varphi_H=90$ degrees.

FIG. 9 includes (c) and (d) which show a result of $B_0^2-A_0^2$ calculated from Equation (17).

FIG. 12 includes (c) and (d) in which results of $\Delta H_{DL}$ and $\Delta H_{FL}$, as a function of $\theta_M^0$, are shown with respect to $R=0.3$ and 1.75.

DETAILED DESCRIPTION

Figure 1:
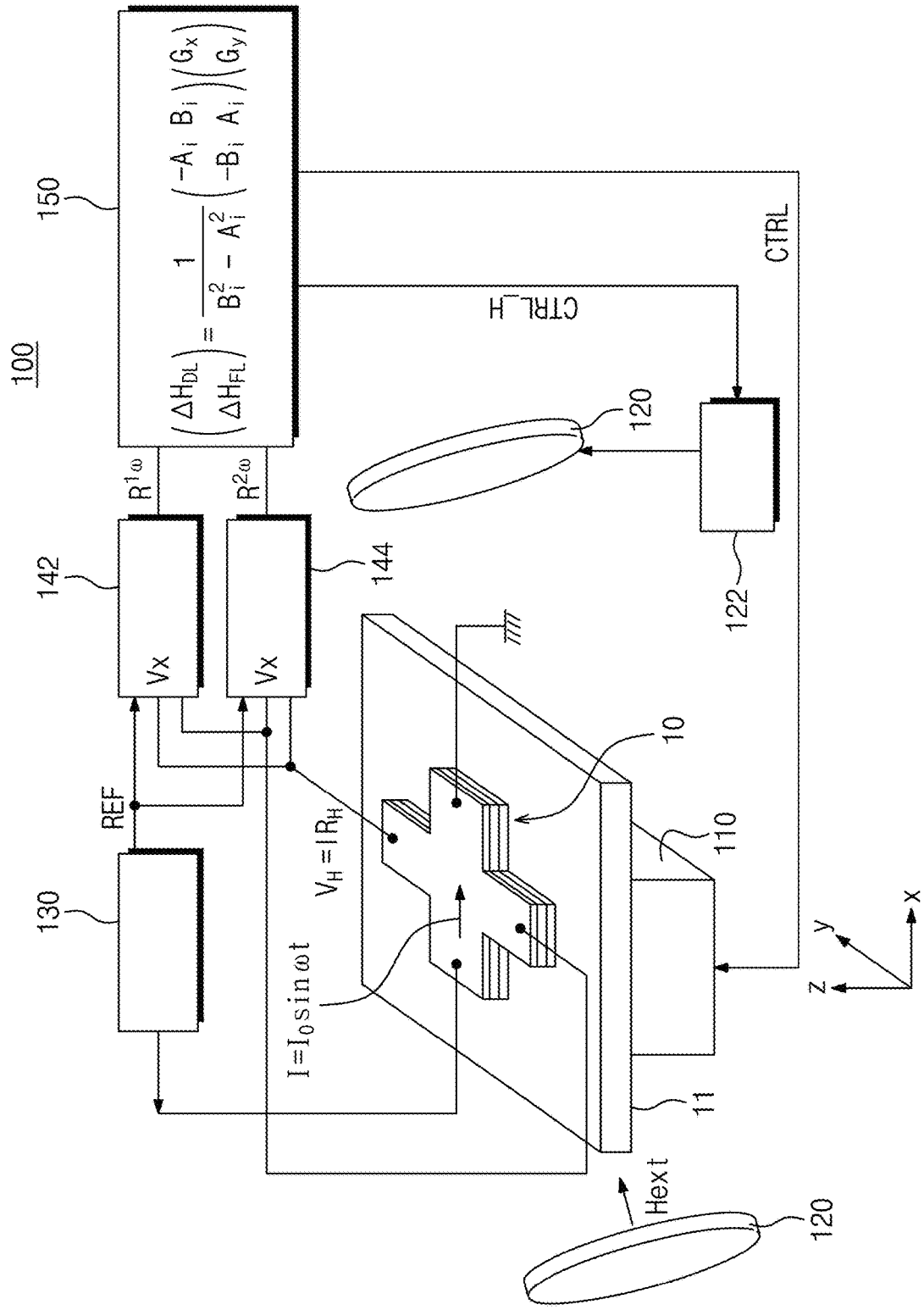
FIG. 1 is a conceptual diagram of a harmonic Hall voltage analysis apparatus according to an example embodiment of the present disclosure.

These divergence problems may be overcome by making a correction required to analyze a measurement result including an out-of-plane component of an external magnetic field $H_{ext}$. Since coherent magnetization rotation is an important requirement for analysis of a harmonic Hall voltage measurement result, the external magnetic field $H_{ext}$ is applied in a slightly inclined (4 to 15 degrees) from a basal plane (xy plane). In this state, a z-component of the external magnetic field Hext has a non-zero value and has been neglected until now to simplify analysis. This assumption is reasonable in a low-$H_{ext}$ range in which a magnetization direction is close to z-axis and consequently, a perpendicular magnetic anisotropy (PMA) magnetic field is more dominant than a z-component of the external magnetic field $H_{ext}$.

However, the simplified assumption is not valid in a high-$H_{ext}$ range any longer and the magnetization direction considerably deviates from z-axis with final reduction of a PMA field. As a result, the dominance over a z-component of the external magnetic field $H_{ext}$ is lost.

In the past, to include a z-component of an external magnetic field $H_{ext}$, there have been several attempts to repeatedly solve and obtain an equilibrium torque equation until convergence is achieved (recursive method). However, this method is significantly complex.

Moreover, effectiveness is not verified in a system in which a planar Hall resistance $R_{PHE}$ is greater than an anomalous Hall effect resistance $R_{AHE}$ ($R_{PHE}>R_{AHE}$). An unwanted voltage generated by thermoelectric effect such as anomalous Nernst effect (ANE) should be removed from a harmonic signal. Although several methods have been proposed to achieve the object, it is still difficult to erase all artificial signals. Since many PMA materials exhibit second-order PMA that is not negligible as compared to first-order PMA, another important problem to be solved is to include the second-order PMA. So far, the second-order PMA is not considered for analysis.

In the present disclosure, two corrections of a z-component and second-order PMA of an external magnetic field $H_{ext}$ are considered when a harmonic Hall voltage measurement result is analyzed. Description of all related analysis equations is included. A macro-spin simulation result is analyzed using both a conventional analysis method and a novel analysis method. Accuracies of the two analysis methods are tested by comparing an input SO effective field used in the macro-spin simulation with an SO effective field calculated by an analysis method. A resistance ratio R defined as $R_{PHE}/R_{AHE}$ is systemically inspected to test the proposed novel analysis method.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

FIG. 1 is a conceptual diagram of a harmonic Hall voltage analysis apparatus according to an example embodiment of the present disclosure.

Referring to FIG. 1, a sample 10 may include nonmagnetic layer/magnetic layer or nonmagnetic layer/magnetic layer/oxide layer which are sequentially stacked on a substrate. The nonmagnetic layer/magnetic layer may be a portion of a magnetic tunnel junction. The magnetic layer may include a single layer such as Co, CoFeB or NiFe or a multilayer thin film such as [Co/Pt]n or [Co/Pd]n. The magnetic layer may have perpendicular magnetic anisotropy. The non-magnetic layer/magnetic layer may be patterned, and a first line extending in x-axis direction and a second line extending y-axis direction may intersect each other. AC plane current may be injected into opposite ends of the first line in the x-axis direction, and opposite ends of the second line in the y-axis direction may be used as terminals to measure a Hall voltage.

To measure a harmonic Hall voltage, an AC current source 130 is connected to the opposite ends of the first line in the x-axis direction. The AC current source 130 may output a sine wave of a reference angular frequency. The reference angular frequency of the AC current source 130 may be several hundreds of hertz (Hz).

The opposite ends of the second line are connected to a first lock-in amplifier 142. Also the opposite ends of the second line are connected to a second lock-in amplifier 144. The first lock-in amplifier 142 extracts a first harmonic component $R^{1\omega}$ from a Hall voltage signal $V_H$ in synchronization with a reference signal REF of the AC current source 130. The second lock-in amplifier 144 extracts a second harmonic component $R^{2\omega}$ from the Hall voltage signal $V_H$ in synchronization with the reference signal REF of the AC current source 130.

An electromagnet 120 receives current from an electromagnet driver 122 to generate an external magnetic field $H_{ext}$. The electromagnet driver 122 controls the magnitude of the external magnetic field $H_{ext}$ through an electromagnet control signal CTRL_H of a controller 150. The controller 150 may control a rotation adjuster 110 to three-dimensionally rotate the sample 10. The rotation adjuster 110 may adjust a polar angle and an azimuthal angle between a coordinate system of the sample 10 and the external magnetic field $H_{ext}$. The external magnetic field $H_{ext}$ may rotate in a direction of the azimuthal angle while its magnitude is adjusted or while having constant magnitude. A swapping period or a rotation period the external magnetic field $H_{ext}$ may be between several tens of seconds and several tens of minutes.

The controller 150 may calculate a damping-like effective field $\Delta H_{DL}$ and a field-like effective field $\Delta H_{FL}$ by receiving the first harmonic component $R^{1\omega}$ of the first lock-in amplifier 142 and the second harmonic component $R^{2\omega}$ of the second lock-in amplifier 144. The controller 150 may collect information on an external magnetic field or have information on a previously corrected external magnetic field through a sensor that measures the external magnetic field $H_{ext}$. The information on an external magnetic field may include magnitude, a polar angle, and an azimuthal angle.

Figure 2:
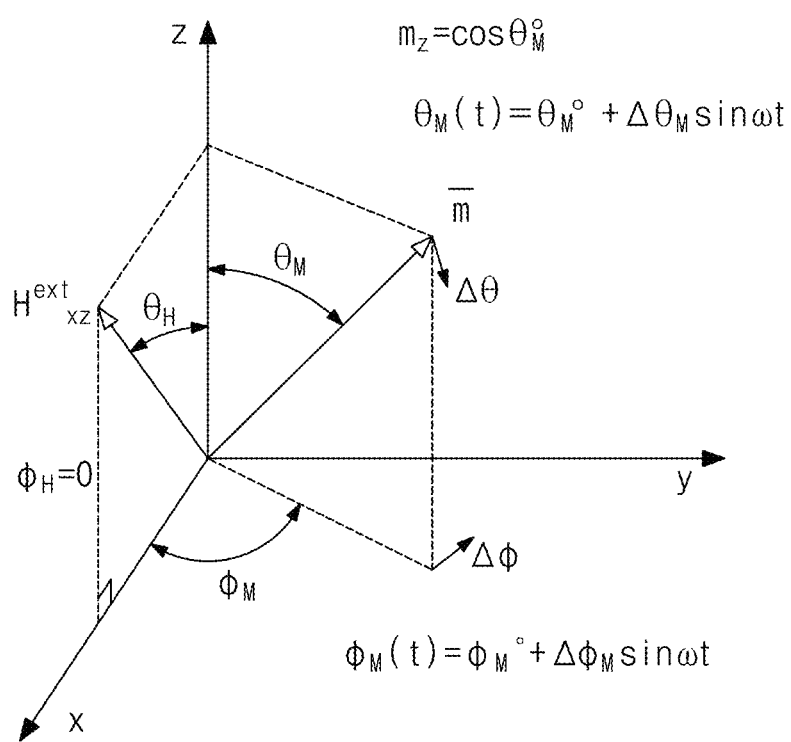
FIG. 2 illustrates a rectangular coordinate system and a spherical coordinate system of a sample according to an example embodiment of the present disclosure.

FIG. 2 illustrates a rectangular coordinate system and a spherical coordinate system of a sample according to an example embodiment of the present disclosure.

Referring to FIG. 2, a magnetic layer of a sample may have a magnetization direction and the magnetization direction may be nearly perpendicular to a disposition plane of the sample when an external magnetic field $H_{ext}$ does not exist. The magnetization direction may be expressed as a polar angle $\theta_M$ and an azimuthal angle $\varphi_M$ in a spherical coordinate system. AC plane current may be injected into opposite ends of a first line in x-axis direction, and opposite ends of a second line in y-axis direction may be used as terminals to measure a Hall voltage.

A direction of the external magnetic field $H_{ext}$ may be expressed as a polar angle $\theta_H$ and an azimuthal angle $\varphi_H$ in the spherical coordinate system.

Figure 3A:
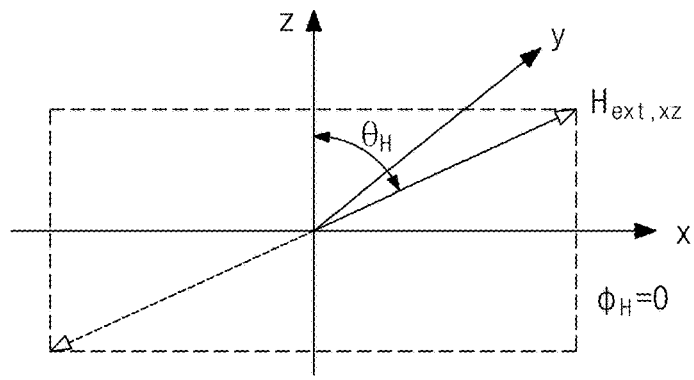
FIGS. 3A through 3C illustrate a first external magnetic field, a second external magnetic field, and a third external magnetic field according to an example embodiment of the present disclosure.
Figure 3B:
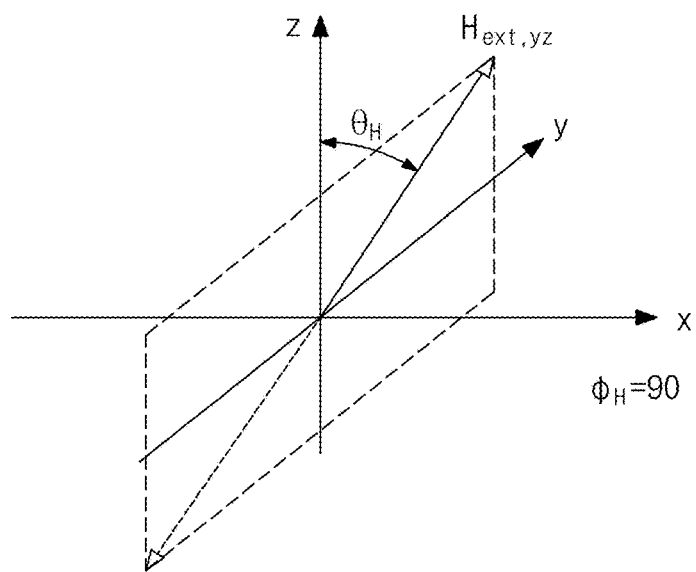
Figure 3C:
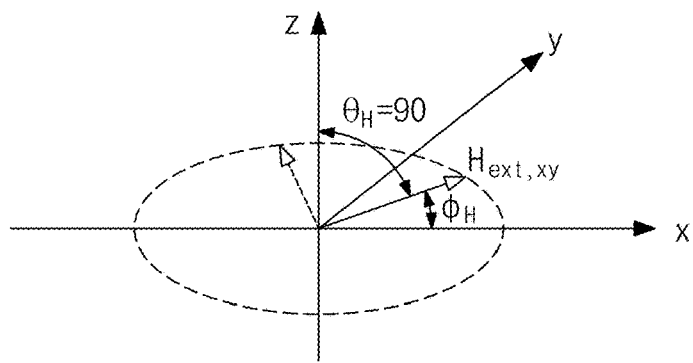

FIGS. 3A through 3C illustrate a first external magnetic field, a second external magnetic field, and a third external magnetic field according to an example embodiment of the present disclosure.

Referring to FIG. 3A, a first external magnetic field $H_{ext,xz}$ may maintain a constant direction in a disposition plane (xy plane) of a sample 10 which is defined by a first direction (x-axis) and a third direction (z-axis) perpendicular to the disposition plane. The magnitude of the first external magnetic field $H_{ext,xz}$ may vary depending on time. That is, for example, a polar angle $\theta_H$ may be 85 degrees and an azimuthal angle $\varphi_H$ may be zero degree.

Referring to FIG. 3B, a second external magnetic field $H_{ext,yz}$ may have the same maximum magnitude as the first external magnetic $H_{ext,xz}$ and may maintain a constant direction in a yz plane defined by a second direction (y-axis) and the third direction (z-axis) perpendicular to the disposition plane (xy plane). The magnitude of the second external magnetic field $H_{ext,yz}$ may vary. That is, for example, a polar angle $\theta_H$ may be 85 degrees and an azimuthal angle $\varphi_H$ may be 90 degrees.

Referring to FIG. 3C, the magnitude of a third external magnetic field $H_{ext,xy}$ may be maintained on the disposition plane (xy plane) and a direction thereof may vary. That is, for example, a polar angle $\theta_H$ may be 90 degrees and an azimuthal angle $\varphi_H$ may be between zero degree and 360 degrees. The magnitude of the third external magnetic field $H_{ext,xy}$ may be sufficiently greater than the maximum magnitude of the first external magnetic field $H_{ext,xz}$. When the third external magnetic field $H_{ext,xy}$ is applied to the sample 10, a magnetization direction of a magnetic field of the sample 10 may be aligned in a direction of the third external magnetic field $H_{ext,xy}$.

Figure 4A:
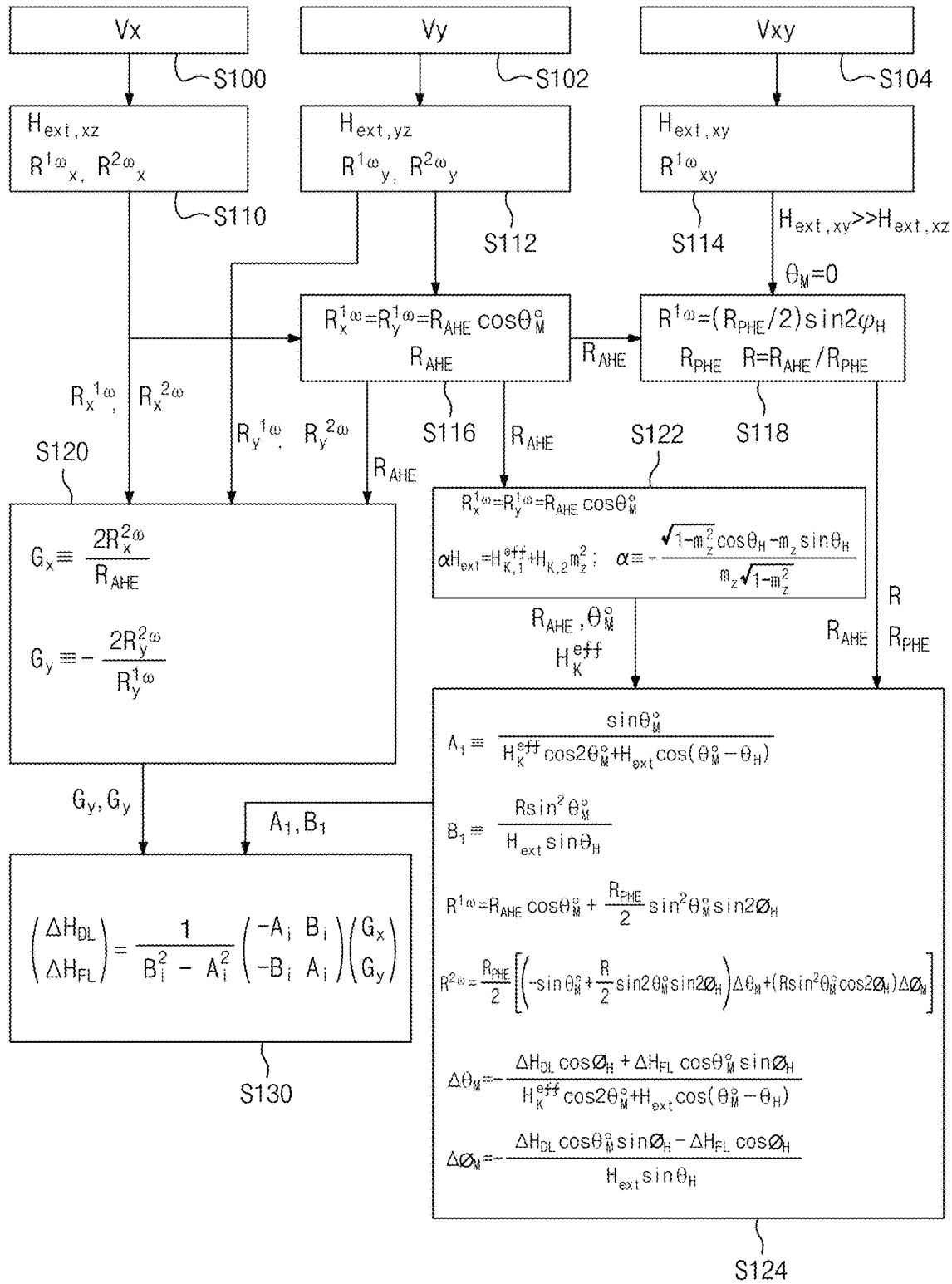
FIGS. 4A and 4B are flowcharts illustrating a harmonic Hall voltage analysis method according to an example embodiment of the present disclosure.
Figure 4B:
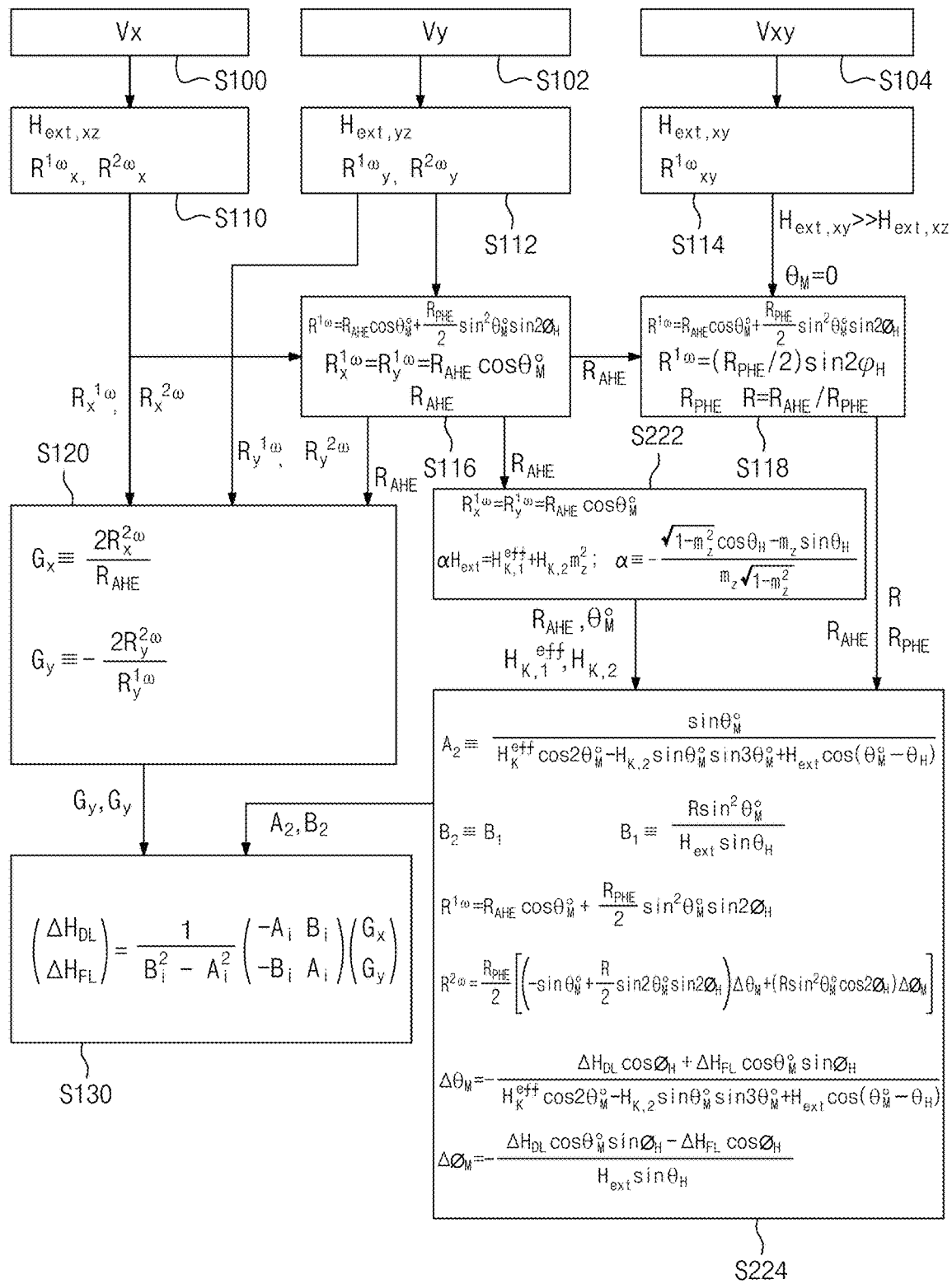

FIGS. 4A and 4B are flowcharts illustrating a harmonic Hall voltage analysis method according to an example embodiment of the present disclosure.

Referring to FIGS. 4A and 4B, a harmonic Hall voltage analysis method may include: measuring a first Hall voltage signal Vx while applying in-plane alternating current (AC) of a sine wave having a basic angular frequency $\omega$ in a first direction (x direction) in which a sample 10 including a nonmagnetic layer/magnetic layer extends according to a first external magnetic field $H_{ext,xz}$ (S100); measuring a second Hall voltage signal Vy while applying the in-plane AC of the sine wave having the basic angular frequency $\omega$ in the first direction (x direction) in which the sample 10 extends according to a second external magnetic field $H_{ext,yz}$ (S102); measuring a third Hall voltage signal Vxy while applying the in-plane AC of the sine wave having the basic angular frequency $\omega$ in the first direction (x direction) in which the sample 10 extends according to a third external magnetic field $H_{ext,xy}$ (S104); extracting a first harmonic Hall resistance component $R^{1\omega}_x$ of the first external magnetic field $H_{ext,xz}$ and a second harmonic Hall resistance component $R^{2\omega}_x$ of the first external magnetic field $H_{ext,xz}$ by using the first Hall voltage signal Vx (S110); extracting a first harmonic Hall resistance component $R^{1\omega}_y$ of the second external magnetic field $H_{ext,yz}$ and a second harmonic Hall resistance component $R^{2\omega}_y$ of the second external magnetic field $H_{ext,yz}$ by using the second Hall voltage signal Vy (S112); extracting a first harmonic Hall resistance component $R^{1\omega}_{xy}$ of the third external magnetic field $H_{ext,xy}$ by using the second Hall voltage signal Vxy (S114); extracting an anomalous Hall effect resistance $R_{AHE}$ by using the first harmonic Hall resistance component $R^{1\omega}_x$ of the first external magnetic field $H_{ext,xz}$ according to the first external magnetic field $H_{ext,xz}$ or the first harmonic Hall resistance component $R^{1\omega y}$ of the second external magnetic field $H_{ext,yz}$ according to the second external magnetic field $H_{ext,yz}$ (S116); extracting a planar Hall resistance $R_{PHE}$ by using the first harmonic Hall resistance component $R^{1\omega}_{xy}$ of the third external magnetic field $H_{ext,xy}$ (S118); extracting a first resistance ratio ($G_x=2R^{2\omega}_x/R_{AHE}$) of the second harmonic Hall resistance component $R^{2\omega}_x$ of the first external magnetic field $H_{ext,xz}$ to the anomalous Hall effect resistance $R_{AHE}$ and a second resistance ratio ($G_y=-2R^{2\omega}_y/R^{1\omega}_y$) of the second harmonic Hall resistance component $R^{2\omega}_y$ of the second external magnetic field $H_{ext,yz}$ to the first harmonic Hall resistance component $R^{1\omega}_y$ of the second external magnetic field $H_{ext,yz}$, respectively (S120); and converting the first resistance ratio $G_x$ and the second resistance ratio $G_y$ into a damping-like effective field $\Delta H_{DL}$ and a field-like effective field $\Delta H_{FL}$ (S130).

The first external magnetic field $H_{ext,xz}$ maintains a constant direction in an xy plane defined by the first direction and a third direction perpendicular to a disposition plane and varies in magnitude.

The second external magnetic field $H_{ext,yz}$ has the same maximum magnitude as the first external magnetic field $H_{ext,xz}$, maintains a constant direction in a yz plane defined by the second direction and the third direction perpendicular to the disposition plane, and varies in magnitude.

The third external magnetic field $H_{ext,xy}$ maintains a constant magnitude on the disposition plane and varies in direction.

The first Hall voltage signal Vx is measured while applying in-plane alternating current I of the sine wave having the basic angular wave co in the first direction (x direction) in which the sample 10 extends in a state where the first external magnetic field $H_{ext,xz}$ is applied. A first lock-in amplifier 142 receives the first Hall voltage signal Vx to output the first harmonic Hall resistance component $R^{1\omega}_x$ of the first external magnetic field $H_{ext,xz}$, and a second lock-in amplifier 144 receives the first Hall voltage signal Vx to extract the second harmonic Hall resistance component $R^{2\omega}_x$ of the first external magnetic field $H_{ext,xz}$. The first harmonic component $R^{1\omega}_x$ of the first external magnetic field $H_{ext,xz}$ and the second harmonic component $R^{2\omega}_x$ of the first external magnetic field $H_{ext,xz}$ may be measured according to the magnitude of the first external magnetic field $H_{ext,xz}$, respectively.

The second Hall voltage signal Vy is measured while applying the in-plane alternating current I of the sine wave having the basic angular wave co in the first direction (x direction) in which the sample 10 extends in a state where the second external magnetic field $H_{ext,yz}$ is applied. The first lock-in amplifier 142 receives the first Hall voltage signal Vy to output the first harmonic Hall resistance component $R^{1\omega}_y$ of the second external magnetic field $H_{ext,yz}$, and the second lock-in amplifier 144 receives the first Hall voltage signal Vy to extract the second Hall resistance component $R^{2\omega}_y$ of the second external magnetic field $H_{ext,yz}$. The first harmonic Hall resistance component $R^{1\omega}_y$ of the second external magnetic field $H_{ext,yz}$ and the second harmonic Hall resistance component $R^{2\omega}_y$ of the second external magnetic field $H_{ext,yz}$ may be measured according to the magnitude of the second external magnetic field $H_{ext,yz}$, respectively.

The third Hall voltage signal Vxy is measured while applying the in-plane alternating current I of the sine wave having the basic angular frequency ω in the first direction (x direction) in which the sample 10 extends in a state where the third external magnetic field $H_{ext,xy}$ is applied. The first lock-in amplifier 142 receives the third Hall voltage signal Vxy to output the first harmonic component $R^{1\omega}_{xy}$ of the third external magnetic field $H_{ext,xy}$. The first harmonic component $R^{1\omega}_{xy}$ of the third external magnetic field $H_{ext,xy}$ may be measured according to an azimuthal angle $\varphi_H$ of the third external magnetic field $H_{ext,xy}$.

A controller 150 may calculate the damping-like effective field $\Delta H_{DL}$ and the field-like effective field $\Delta H_{FL}$ through an algorithm that will be described below.

[Simulation Model]

A macro-spin simulation was conducted by numerically solving a Landau-Lifshitz-Gilbert (LLG) equation. Since an angular frequency ω of alternating current (AC) is much lower than a Larmor frequency when a harmonic Hall voltage is measured, a quasi-static assumption ($\partial m/\partial t=0$) is valid and a resulting equation is given as follows.

$$m \times (H_{K,1}^{eff} m_z \hat{z} + H_{K,2} m_z^3 \hat{z} + H_{ext} + \Delta H) = 0 \quad \text{Equation (1)}$$

$$\Delta H \equiv \Delta H_{DL} m \times \hat{y} - \Delta H_{FL} \hat{y} \quad \text{Equation (2)}$$

where m and $m_z$ represent a unit vector and a z-component of magnetization, respectively; $H_{K,1}^{eff}$ and $H_{K,2}$ represent a first-order effective PMA magnetic field and a second-order PMA magnetic field, respectively; $H_{K,1}^{eff}$ represents the sum of the first-order PMA magnetic field $H_{K,1}$ and a demagnetizing magnetic field $-N_d M_S$; $M_S$ and $N_d$ represent a saturation magnetization factor and a demagnetizing factor, respectively; y represents a direction perpendicular to both a flowing direction x of current and a perpendicular direction z of a thin film; and $\Delta H$ represents an effective magnetic field induced by in-plane current. Three components of the magnetization m. i.e., $m_x$, $m_y$, and $m_z$ may be expressed as $\sin\theta_M \cos\varphi_M$, $\sin\theta_M \sin\varphi_M$, and $\cos\theta_M$ in a spherical polar coordinate system, respectively ($\theta_M$ and $\varphi_M$ being a polar angle and an azimuthal angle, respectively). The vector $\Delta H$ of the effective magnetic field inducted by the in-plane current includes a damping-like effective field $\Delta H_{DL}$ and a field-like effective field $\Delta H_{FL}$. Three components of the effective magnetic field $\Delta H$, i.e., $\Delta H_x$, $\Delta H_y$, and $\Delta H_z$ may be expressed as $-\Delta H_{DL} m_z$, $-\Delta H_{FL}$, $\Delta H_{DL} m_x$, respectively. When in-plane alternating current expressed as ($I=I_0 \sin \omega t$) is applied, $\Delta H$ may be replaced with $\Delta H \sin \omega t$ in the Equation (1). An input of the macro-spin is as follows: $H_{K,1}^{eff}=5$ kOe, $H_{K,2}=0$ or $-1$ kOe, $\Delta H_{DL}=-50$ Oe, $\Delta H_{FL}=-100$ Oe, $\theta_H=86$ degrees, and $\varphi_H=0$ degree or 90 degrees. Values of $H_{ext}$ and ωt varied from +10 to 6π at −10 kOe and 0. The Equation (3) was used to define $H_{K,1}$ and $H_{K,2}$. Thus, the effective PMA magnetic field $H_K^{eff}$ may be obtained as the sum of a first-order PMA $H_{K,1}^{eff}$ magnetic field and a second-order magnetic field $H_{K,2}$ ($H_K^{eff}=H_{K,1}^{eff}+H_{K,2}$).

$$E_{ani} = -\frac{M_S H_{K,1}}{2}\cos^2\theta_M - \frac{M_S H_{K,2}}{4}\cos^4\theta_M - \ldots \approx \quad \text{Equation (3)}$$

$$-\frac{M_S H_K}{2}\cos^2\theta_M$$

Uniaxial energy $E_{ani}$ approximated to a linear term HK is expressed at a right hand side of the Equation (3). In the Equation (3), Ms represents a saturation magnetization. There is a relationship among three parameters, as follows: $H_K=H_{K,1}+H_{K,2}$.

[Analysis Equation]

A. Vibration of Magnetic Moment

When an in-plane AC current is applied to an NM/FM double-layer structure having an angular frequency ω, values of $\theta_M$ and $\varphi_M$ vibrate as $\theta_M(t) = \theta_M^0 + \Delta\theta_M \sin \omega t$ and $\varphi_M(t) = \varphi_M^0 + \Delta\varphi_M \sin \omega t$, respectively. As variables, an equilibrium polar angle $\theta_M^0$ and an equilibrium azimuthal angle $\varphi_M^0$ represent the values of $\theta_M$ and $\varphi_M$ when AH does not exist. If in-plane anisotropy is negligibly small in a PMA field, it will be assumed that $\varphi_M^0$ and $\varphi_H$ are equal to each other. Values of $\Delta\theta_M$ and $\Delta\varphi_M$ may be analytically expressed as follows.

$$\Delta\theta_M = -\frac{\Delta H_{DL}\cos\phi_H + \Delta H_{FL}\cos\theta_M^0 \sin\phi_H}{H_K^{eff}\cos 2\theta_M^0 + H_{ext}\cos(\theta_M^0 - \theta_H)} \quad \text{Equation (4)}$$

$$\Delta\phi_M = \frac{\Delta H_{DL}\cos\theta_M^0 \sin\phi_H - \Delta H_{FL}\cos\phi_H}{H_{ext}\sin\theta_H} \quad \text{Equation (5)}$$

In the Equations (4) and (5), $H_{ext}$ represents a value of an external magnetic field at the moment when an equilibrium angle is put as a specific value $\theta_M^0$. When values of $\Delta\theta_M$ and $\Delta\varphi_M$ are sufficiently small, a component of an m vector may be approximated in the form as follows: $m(t) = m^{1\omega} + 2 m^{2\omega} \sin \omega t$.

$$m_x \approx \sin\theta_M^0 \cos\phi_H + (\Delta\theta_M \cos\theta_M^0 \cos\phi_H - \Delta\phi_M \sin\theta_M^0 \sin\phi_H)\sin\omega t \quad \text{Equation (6)}$$

$$m_y \approx \sin\theta_M^0 \sin\phi_H + (\Delta\theta_M \cos\theta_M^0 \sin\phi_H + \Delta\phi_M \sin\theta_M^0 \cos\phi_H)\sin\omega t \quad \text{Equation (7)}$$

$$m_z \approx \cos\theta_M^0 - \Delta\theta_M \sin\theta_M^0 \sin\omega t \quad \text{Equation (8)}$$

Although (magnetization time-independent component $m^{1\omega}$) indicates an equilibrium position of m, a magnetization time-independent component $m^{2\omega}$ indicates vibration amplitude of m.

B. Existing Approach

Anomalous and plane Hall magnetic resistances contribute to a measured Hall magnetic resistance ($R_H = R_{AHE}m_z + R_{PHE}m_x m_y$). While AC current ($I = I_0 \sin \omega t$) is applied, the m value may be expressed as Equations (6) to (8). Expressions for a Hall magnetic resistance $R_H$ are as follows, in which $I_0$ represents amplitude of current.

$$IR_H = I_0 R_H \sin\omega t = I_0 R^{2\omega} + I_0 R^{1\omega}\sin\omega t - I_0 R^{2\omega}\cos 2\omega t \quad \text{Equation (9)}$$

$$R^{1\omega} = R_{AHE}\cos\theta_M^0 + \frac{R_{PHE}}{2}\sin^2\theta_M^0 \sin 2\phi_H \quad \text{Equation (10)}$$

$$R^{2\omega} = \frac{R_{AHE}}{2}\left[\left(-\sin\theta_M^0 + \frac{R}{2}\sin 2\theta_M^0 \sin 2\phi_H\right)\Delta\theta_M + (R\sin^2\theta_M^0 \cos 2\phi_H)\Delta\phi_M\right] \quad \text{Equation (11)}$$

A first-order harmonic resistance $R^{1\omega}$ includes information on an $m^{1\omega}$ value ($R^{1\omega} = R_{AHE}m_z^{1\omega} + R_{PHE}m_x^{1\omega}m_y^{1\omega}$), whereas a second-order harmonic resistance $R^{2\omega}$ includes information on an $m^{2\omega}$ value [$R^{2\omega} = R_{AHE}m_z^{2\omega} + R_{PHE}(m_x^{1\omega}m_y^{2\omega} + m_x^{2\omega}m_y^{1\omega})$].

An existing analysis equation considers only a case where a magnetization direction slightly deviates from z-axis ($\theta_M^0 \sim 0$ degree). In this case, a z-component of Hext is negligibly small with respect to a PMA magnetic field in the same direction ($H_{ext}\cos\theta_H \ll H_K^{eff}\cos\theta_M^0$). Thus, an assumption of $\sin\theta_M^0 = H_{ext}/H_K^{eff}$ made from a conventional solution is reasonable. Under the assumption, $R^{1\omega}$ and $R^{2\omega}$ may be rewritten as follows.

$$R_x^{1\omega} = R_y^{1\omega} = R_{AHE}\sqrt{1 - \left(\frac{H_{ext}}{H_K^{eff}}\right)^2} \quad \text{Equation (12)}$$

$$R_x^{2\omega} = \frac{R_{AHE}H_{ext}}{2(H_K^{eff})^2}\left[\frac{\Delta H_{DL}}{1 - (H_{ext}/H_K^{eff})^2} - R\Delta H_{FL}\right] \quad \text{Equation (13)}$$

$$R_y^{2\omega} = \frac{R_{AHE}H_{ext}}{2(H_K^{eff})^2}\sqrt{1 - \left(\frac{H_{ext}}{H_K^{eff}}\right)^2}\left[\frac{\Delta H_{FL}}{1 - (H_{ext}/H_K^{eff})^2} - R\Delta H_{DL}\right] \quad \text{Equation (14)}$$

In the Equations (12) to (14), subscripts x and y represents $\varphi_H$ values of zero degree and 90 degrees, respectively. A second-order harmonic wave given in the Equations (13) and (14) includes two terms. If a ration $R = R_{PHE}/R_{AHE}$ is negligibly small, values of $\Delta H_{DL}$ and $\Delta H_{FL}$ may be obtained using a ratio T, as follows.

$$T_x \equiv -\frac{2R_x^{2\omega}}{(\partial R_x^{1\omega}/\partial H_{ext})}\left(\frac{R_x^{1\omega}}{R_{AHE}}\right) = A_0\Delta H_{DL} - B_0\Delta H_{FL} \quad \text{Equation (15)}$$

$$T_y \equiv \frac{2R_y^{2\omega}}{(\partial R_y^{1\omega}/\partial H_{ext})} = B_0\Delta H_{DL} - A_0\Delta H_{FL} \quad \text{Equation (16)}$$

$$A_0 \equiv 1, \quad B_0 \equiv R\left(1 - \left(\frac{H_{ext}}{H_K^{eff}}\right)^2\right) \quad \text{Equation (17)}$$

When R=0, values of $T_x$ and $T_y$ are equal to the values of $\Delta H_{DL}$ and $\Delta H_{FL}$, respectively. If a ratio R increases, Tx and Ty should be corrected using the Cramer's Rule.

$$\begin{pmatrix}\Delta H_{DL} \\ \Delta H_{FL}\end{pmatrix} = \frac{1}{B_0^2 - A_0^2}\begin{pmatrix}-A_0 & B_0 \\ -B_0 & A_0\end{pmatrix}\begin{pmatrix}T_x \\ T_y\end{pmatrix} \quad \text{Equation (18)}$$

In the Equation (18), the $\Delta H_{DL}$ and $\Delta H_{FL}$ may be calculated when a determinant $(B_0^2 - A_0^2)$ is not zero. If the determinant $(B_0^2 - A_0^2)$ is zero, individual values of the $\Delta H_{DL}$ and $\Delta H_{FL}$ cannot be obtained. Rather, only a relational expression ($T_x = T_y = \Delta H_{DL} - \Delta H_{FL}$) can be obtained.

C. Method Proposed in the Present Disclosure

An assumption of $H_{ext}\cos\theta_H \ll H_K^{eff}\cos\theta_M^0$ is not valid at a high $H_{ext}$ value any longer. In this case, since a $\theta_H$ value is not negligible, equations are obtained by substituting $\Delta\theta_M$ [Equation (4)] and $\Delta\varphi_M$ [Equation (5)] into the Equation (11), as follows (S124).

$$R_x^{2\omega} = \frac{R_{AHE}}{2}[A_1\Delta H_{DL} - B_1\Delta H_{FL}] \quad \text{Equation (19)}$$

$$R_y^{2\omega} = -\frac{R_{AHE}\cos\theta_M^0}{2}[B_1\Delta H_{DL} - A_1\Delta H_{FL}] \quad \text{Equation (20)}$$

$$A_1 \equiv \frac{\sin\theta_M^0}{H_K^{eff}\cos 2\theta_M^0 + H_{ext}\cos(\theta_M^0 - \theta_H)} \quad \text{Equation (21)}$$

-continued $$B_1 \equiv \frac{R\sin^2\theta_M^o}{H_{ext}\sin\theta_H} \quad \text{Equation (22)}$$

Considering $R_x^{1\omega} = R_y^{1\omega} = R_{AHE} \cos\theta_M^0$, a G ratio corresponding to a T ratio used in a conventional approach may be defined as Equations (23) and (24) (S120). The $\theta_H$ value is a value set while applying an external magnetic field, and the magnitude of the external magnetic field $H_{ext}$ is the magnitude of the first external magnetic field $H_{ext,xz}$ or the second external magnetic field $H_{ext,yz}$.

$$G_x \equiv \frac{2R_x^{2\omega}}{R_{AHE}} = A_1\Delta H_{DL} - B_1\Delta H_{FL} \quad \text{Equation (23)}$$

$$G_y \equiv -\frac{2R_y^{2\omega}}{R_y^{1\omega}} = B_1\Delta H_{DL} - A_1\Delta H_{FL} \quad \text{Equation (24)}$$

It is expected that both the $\Delta\theta_M$ and $\Delta\varphi_M$ will be affected by existence of a second-order PMA. However, detailed derivation shows that there is no change in analysis equation of $\Delta\varphi_M$. Under existence of the second-order PMA, the $\Delta\theta_M$ is expressed as follows.

$$\Delta\theta = -\frac{\Delta H_{DL}\cos\phi_H + \Delta H_{FL}\cos\theta_M^o\sin\phi_H}{H_K^{eff}\cos2\theta_M^o - H_{K,2}\sin\theta_M^o\sin3\theta_M^o + H_{ext}\cos(\theta_M^o - \theta_H)} \quad \text{Equation (25)}$$

In the case that $H_{K,2}=0$, the Equation (25) converges to the Equation (4). If the Equation (25) is used instead of the Equation (4), the Equations (21) and (22) may be modified as follows (S224).

$$A_2 \equiv \frac{\sin\theta_M^o}{H_K^{eff}\cos2\theta_M^o - H_{K,2}\sin\theta_M^o\sin3\theta_M^o + H_{ext}\cos(\theta_M^o - \theta_H)} \quad \text{Equation (26)}$$

$$B_2 = B_1 = \frac{R\sin^2\theta_M^o}{H_{ext}\sin\theta_H} \quad \text{Equation (27)}$$

Similar to an existing analysis equation, a proposed equation is also calculated using the Cramer's rule.

$$\begin{pmatrix} \Delta H_{DL} \\ \Delta H_{FL} \end{pmatrix} = \frac{1}{B_i^2 - A_i^2} \begin{pmatrix} -A_i & B_i \\ -B_i & A_i \end{pmatrix} \begin{pmatrix} G_x \\ G_y \end{pmatrix} \quad \text{Equation (28)}$$

When $H_{K,2}=0$, a subscript i=1 and the Equations (21) and (22) are used. When $H_{K,2}\neq 0$, the subscript i=2 and the Equations (26) and (27) are used.

Figure 5:
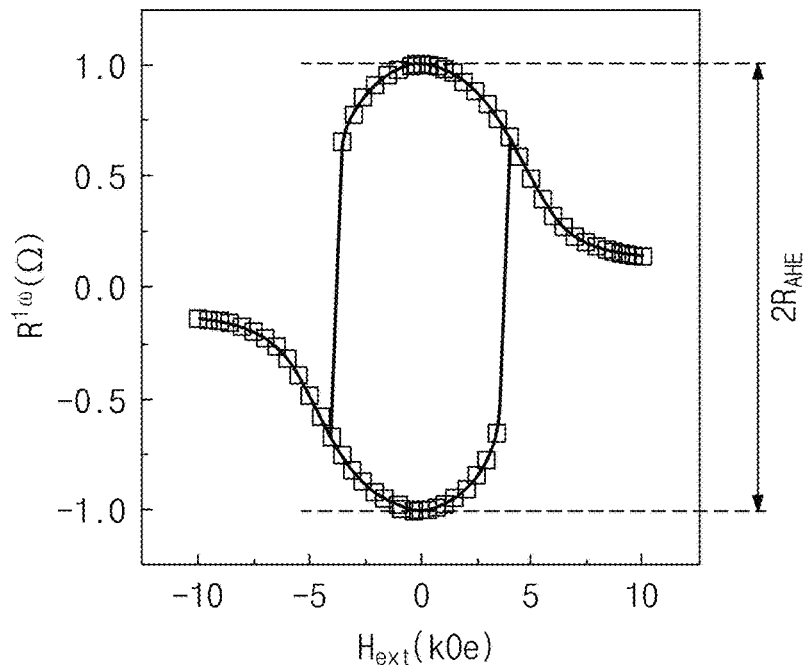
FIG. 5 is a graph illustrating a method for extracting an anomalous Hall effect resistance $R_{AHE}$ according to an example embodiment of the present disclosure.

FIG. 5 is a graph to illustrate a method for extracting an anomalous Hall effect resistance $R_{AHE}$ according to an example embodiment of the present disclosure.

Referring to FIG. 5, a first harmonic signal $R_y^{1\omega}$ of a second external magnetic field $H_{ext,yz}$ is expressed according to the magnitude of the second external magnetic field $H_{ext,yz}$. The first harmonic signal $R_y^{1\omega}$ of the second external magnetic field $H_{ext,yz}$ exhibits hysteresis characteristics according to the magnitude of a second external magnetic field $H_{ext,yz}$. The anomalous Hall effect resistance RAHE may be obtained as a difference between a highest point and a lowest point of a magnetic hysteresis curve when the second external magnetic field $H_{ext,yz}$ is zero (S116).

When the anomalous Hall effect resistance RAHE is obtained, an equilibrium polar angle $\theta_M^0$ may be as follows (S122).

$$R_x^{1\omega} = R_y^{1\omega} = R_{AHE}\cos\theta_M^0 \quad \text{Equation (29)}$$

$$\theta_M^0 = \cos^{-1}\left(\frac{R_x^{1\omega}}{R_{AHE}}\right)$$

Figure 6:
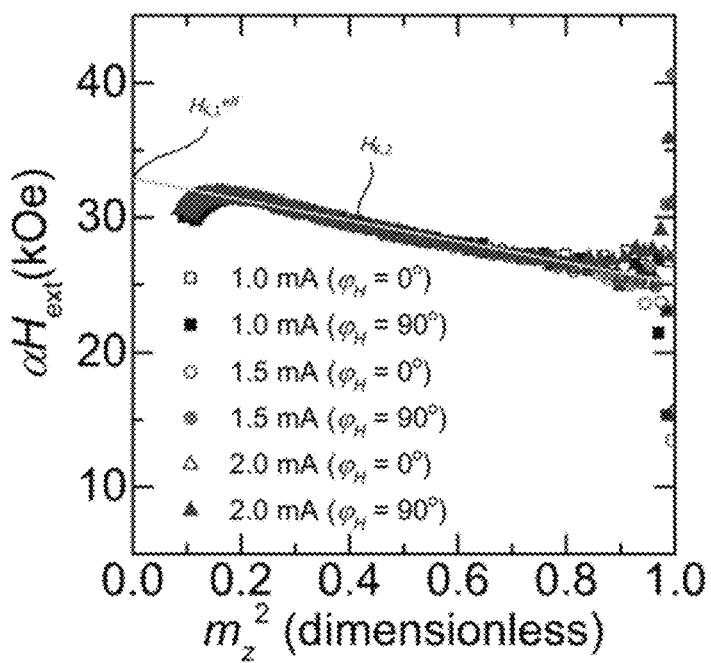
FIG. 6 illustrates a method for extracting an effective PMA magnetic field $H^{eff}_K$ and a second-order PMA magnetic field $H_{K,2}$ according to an example embodiment of the present disclosure.

FIG. 6 illustrates a method for extracting an effective PMA magnetic field $H^{eff}_K$ and a second-order PMA magnetic field $H_{K,2}$ according to an example embodiment of the present disclosure.

Referring to FIG. 6, a generalized Sucksmith-Thompson (GST) method is a well-known technique for accurate determination of a first-order effective PMA magnetic field $H_{K,1}^{eff}$ and a second-order PMA magnetic field $H_{K,2}$. A key point of the GST method is to use the following equation that can be derived from the total energy equation.

$$\alpha H_{ext} = H_{K,1}^{eff} + H_{K,2}m_z^2; \quad \text{Equation (30)}$$

$$\alpha \equiv -\frac{\sqrt{1-m_z^2}\cos\theta_H - m_z\sin\theta_H}{m_z\sqrt{1-m_z^2}}$$

A test result measured under various conditions is shown as a line in a plot of $\alpha_{Hext}$ to $m_z^2$. The first-order effective PMA magnetic field $H_{K,1}^{eff}$ and the second-order PMA magnetic field $H_{K,2}$ may be extracted from the intercept and slope of a fitted straight line, respectively (S122 and S222). The effective PMA magnetic field $H_K^{eff}$ is given by the sum of the first-order effective PMA magnetic field $H_{K,1}^{eff}$ and the second-order PMA magnetic field $H_{K,2}$.

Figure 7:
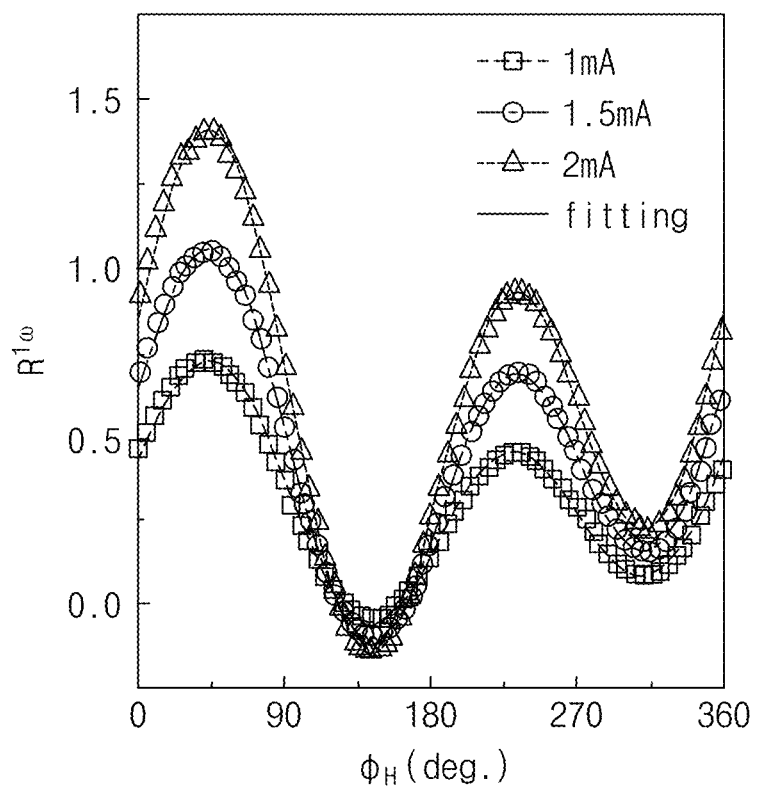
FIG. 7 is a graph to extract a planar Hall resistance $R_{PHE}$ according to an example embodiment of the present disclosure.

FIG. 7 is a graph to extract a planar Hall resistance $R_{PHE}$ according to an example embodiment of the present disclosure.

Referring to FIG. 7, one or all of components should be measured to divide a total second-order harmonic signal into anomalous Hall effect (AHE) and plane Hall effect (PHE). In the present disclosure, $R_{PHE}$ was obtained by measuring a first-order harmonic resistance $R^{1\omega}$ swept from 0 degree to 360 degrees.

Under the condition that $\theta_H=90$ degrees and $H_{ext} \gg H_K^{eff}$ an approximate estimate of the $R_{PHE}$ may be obtained using an approximate relationship: $R^{1\omega} \sim (R_{PHE}/2) \sin 2\varphi_H$.

That is, the planar Hall resistance $R_{PHE}$ may be calculated by fitting the first-order harmonic resistance $R^{1\omega}$ depending on an azimuthal angle $\varphi_H$ (S118).

[Test of Analysis Method]
A. Result of Macro-Spin Simulation for m
FIG. 8 includes (a) to (c) which show a result of a macro-spin simulation at $\varphi_H=0$ degree.

Figure 8:
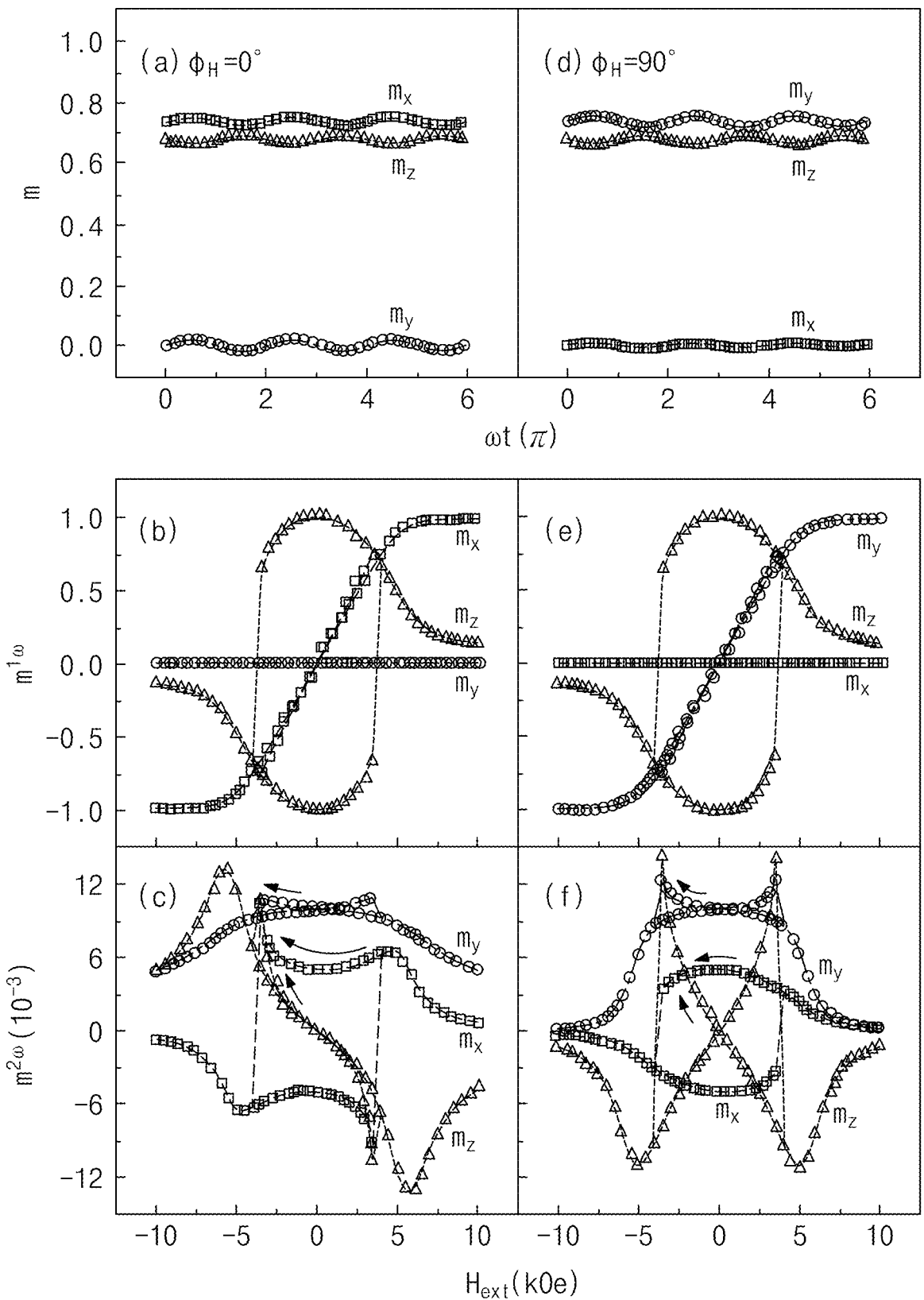
FIG. 8 includes (a) to (c) which show a result of a macro-spin simulation at $\varphi_H=0$ degree.

Referring to (a) to (c) in FIG. 8, three components m ($m_x$, $m_y$, $m_z$), $m^{1\omega}$ ($m_x^{1\omega}$, $m_y^{1\omega}$, $m_z^{1\omega}$), and $m^{2\omega}$ ($m_x^{2\omega}$, $m_y^{2\omega}$, $m_z^{2\omega}$) are shown at $\varphi_H=0$ degree.

FIG. 8 includes (d) to (f) which show a result of the macro-spin simulation at $\varphi_H=90$ degrees.

Referring to (d) to (f) in FIG. 8, three components m ($m_x$, $m_y$, $m_z$), $m^{1\omega}$ ($m_x^{1\omega}$, $m_y^{1\omega}$, $m_z^{1\omega}$), and $m^{2\omega}$ ($m_x^{2\omega}$, $m_y^{2\omega}$, $m_z^{2\omega}$) are shown at $\varphi_H=90$ degrees.

In both the cases (i.e., at $\varphi_H=0$ degree and $\varphi_H=90$ degrees), a second-order PMA was not considered ($H_{K,2}=0$ kOe). The $m^{1\omega}$ and $m^{2\omega}$ were obtained using a lock-in amplifier used to measure a harmonic Hall voltage.

The result of (a) to (f) in FIG. 8 may be described well by the Equations (4) to (8). For example, under the condition that $\varphi_H=0$ degree and $H_{ext}=4$ kOe, three components of m vibrate sinusoidally around an equilibrium position. A sign of $m_x^{2\omega}$ is positive, while a sign of $m_z^{2\omega}$ is negative. This may be described by relationships ($m_x^{2\omega} \propto \Delta\theta_M \cos\theta_M^0$) and ($m_z^{2\omega} \propto -\Delta\theta_M \sin\theta_M^0$) derived from the Equations (6) and (8).

Note that $\Delta\theta_M$ value is simply in proportion to $-\Delta H_{DL}$ at $\varphi_H=0$ degree. A sign of $m_y^{2\omega}$ is the same as the sign of $m_x^{2\omega}$ ($m_y^{2\omega} \propto -\Delta H_{FL} \sin\theta_M^0$ [Equations (5) and (7)]). Both signs of $\Delta H_{DL}$ and $\Delta H_{FL}$ are negative.

A result of the $m^{1\omega}$ will be straightforwardly understood as a function of the $H_{ext}$. Since a y-component of the $H_{ext}$ is not zero at $\varphi_H=0$ degree, the $m_y^{1\omega}$ is zero in the overall range. When the $H_{ext}$ value is much greater than the $H_K^{eff}$ value (5 kOe), values of the $m_x^{1\omega}$ and $m_z^{\omega}$ are close to 1 and zero, respectively. This is because a direction of m approaches a direction of the $H_{ext}$ ($\theta=86$ degrees and $\varphi_H=0$ degree). Since m rotates in z-axis direction due to a PMA field as the $H_{ext}$ value decreases, the $m_z^{1\omega}$ value increases to 1 as the Hext value decreases zero ($m_x^{1\omega}=0$ and $m_z^{\omega}=1$).

As the $H_{ext}$ value increases from zero to $-10$ kOe in a reverse direction, the $m_z^{1\omega}$ value decreases again. Magnetization switching occurs at $H_{ext}=-3.8$ kOe. A time-dependent component is associated with both an equilibrium position of m and an SO effective field. An $m_x^{2\omega}$ value is in inverse proportion to $H_{ext}$ when $H_{ext} \gg H_K^{eff}$. As derived from the Equations (4) and (6), this will be described by an approximate equation of $m_x^{2\omega} \sim -\Delta H_{DL} \cos\theta_H/2 (H_{ext}-H_K^{eff})$ that is $\theta_M^0 \sim \theta_H=86$ degrees. Similarly, $m_z^{2\omega}$ is in inverse proportion to $H_{ext}$, which will be described by a relational expression of $m_z^{2\omega} \sim \Delta H_{DL}/2 (H_{ext}-H_K^{eff})$ [Equations (4) and (8)]. An analytic expression reflects well the fact that the two fields $H_{ext}$ and $H_K^{eff}$ try to coerce m in their directions and the equilibrium m is achieved by competition between the two fields $H_{ext}$ and $H_K^{eff}$. Within the range of $H_{ext} \gg H_K^{eff}$, m follows $H_{ext}$. Since the $H_{ext}$ loses the dominance on the $H_K^{eff}$ within an intermediate range of $H_{ext} \sim H_K^{eff}$, absolute values of $m_x^{2\omega}$ and $m_z^{2\omega}$ indicate a maximum. Since an influence of the PMA field is great, the absolute values of $m_x^{2\omega}$ and $m_z^{2\omega}$ decrease again as the $H_{ext}$ decreases. In the case of $\theta_M^0 \sim 0$ degree with respect to the range of $H_{ext} \ll H_K^{eff}$, the $m_x^{2\omega}$ approaches a value of $5 \times 10^{-3}$. This may be described by an approximate analysis equation of $-\Delta H_{DL} \cos\theta_M^0/2H_K^{eff}$ derived from the Equations (4) and (8). In this area, as can be described by an approximate analysis expression of $\Delta H_{DL} \sin\theta_M^0/2H_K^{eff}$, the $m_z^{2\omega}$ value approaches zero. A sign of $m_x^{2\omega}$ ($\propto \Delta\theta_M \cos\theta_M^0$) changes at $H_{ext}=-3.8$ kOe due to switching of $m_z^{1\omega}$ (=$\cos\theta_M^0$). However, since a sign of $m_x^{1\omega}$ (=$\sin\theta_M^0$) remains the same while being switched, a sign of $m_z^{2\omega}$ ($\propto -\Delta\theta_M \sin\theta_M^0$) does not change.

An $m_y^{2\omega}$ value increases flatly as the $H_{ext}$ decreases from 10 kOe to 0 kOe, which may be described by an approximate analysis equation of $-\Delta H_n \sin\theta_M^0/2H_{ext}$ derived from the Equations (5) and (7). Since the $H_{ext}$ operates as a coupling field to $m_y$, this is reasonable. If $H_{ext}$ approaches zero, both $\sin\theta_M$ and $H_{ext}$ approach zero. Thus, $m_y^{2\omega}$ converges to a specific value. Since the $H_{ext}$ is various from zero to $-10$ kOe, the $m_y^{2\omega}$ increases before switching and decreases after switching. Due to the $m_x^{1\omega}$ (=$\sin\theta_M^0$), a sign of $m_y^{2\omega}$ ($\propto \Delta\varphi_M \sin\theta_M^0$) does not change.

Under the condition that $\varphi_H=90$ degrees and $H_{ext}=4$ kOe, signs of $m_x^{2\omega}$ and $m_y^{2\omega}$ are positive, while a sign of $m_z^{2\omega}$ is negative. This is expected in an analysis equation of $m_x^{2\omega}=-(\frac{1}{2})\Delta\varphi_M \sin\theta_M^0$, $m_y^{2\omega}=(\frac{1}{2})\Delta\theta_M \cos\theta_M^0$, $m_z^{2\omega}=(\frac{1}{2})\Delta\theta_M \sin\theta_M^0$. In the Equations (4) and (5), $\Delta\theta_M$ and $\Delta\varphi_M$ are simply in proportion to $\Delta H_{FL}$ and $\Delta H_{DL}$, respectively. Therefore, vibrations of $m_y$ and $m_z$ are caused by $\Delta H_{FL}$, and a vibration of $m_x$ is caused by $\Delta H_{DL}$. Change of $m^{1\omega}$ as a function of the $H_{ext}$ at $\varphi_H=90$ degrees is nearly the same as change at $\varphi_H=0$ degree. Only one difference therebetween is that operations of $m_x^{1\omega}$ and $m_y^{1\omega}$ are interchanged. As the $H_{ext}$ decreases from 10 to 0 kOe, the $m_x^{2\omega}$ value increases flatly. This may be described by an approximate analysis equation of $-\Delta H_{DL} \sin 2\theta_M^0/4H_{ext}$ derived from the Equations (5) and (6).

Since only the $H_{ext}$ is combined with the $m_x$, a peak of the $m_x^{2\omega}$ at $\varphi_H=0$ degree disappears at $\varphi_H=90$ degrees. The $m_y^{2\omega}$ is affected by the $H_{ext}$ and the $H_K^{eff}$, but the peak is not shown at $\varphi_H=90$ degrees. This is because a component of the SO effective field causing vibration of m is not $-\Delta H_{FL}$ but $-\Delta H_{FL} \cos\theta_M^0$. An angle between m and $-\Delta H_{FLy}$ is (90 degrees+$\theta_M^0$) at $\varphi_H=90$ degrees.

At $\varphi_D=0$ degree, a component of the SO effective magnetic field causing the vibration of m is $\Delta H_{DL}$. This is because an angle between m and $\Delta H_{DL}$m×y is 90 degrees. As the $H_{ext}$ decreases from 10 to 0 kOe and the $\theta_M^0$ decreases from 90 degrees to zero degree, the component of the SO effective field causing the vibration of m increase from zero to $\Delta H_{DL}$. Thus, a peak of the $m_y^{2\omega}$ is covered by an influence of increase. Increase of the component of the SO effective field affects behavior of $m_z^{2\omega}$. An $H_{ext}$ value at which the peak of $m_z^{2\omega}$ occurs is 5.8 kOe at $\varphi_H=0$ degree and moves to 5.0 kOe at $\varphi_H=90$ degrees. An absolute value of $m_z^{2\omega}$ at the peak is greater at $\varphi_H$=zero degree than $\varphi_H=90$ degrees. When an input $\Delta H_{FL}$ value is twice as great as a $\Delta H_{DL}$ value, a difference between the two peaks is an unexpected result. A switching behavior of $m^{2\omega}$ at $\varphi_H$=zero degree is different from that of $m^{2\omega}$ at $\varphi_H=90$ degrees. For example, a sign of $m_z^{2\omega}$ ($\sim -\Delta H_{DL} \sin\theta_M^0 \cos\theta_M^0/2H_{ext}$) at $\varphi_H=90$ degrees varies depending on roles of $m_y^{1\omega}$ (=$\sin\theta_M^0$) and $m_z^{1\omega}$ (=$\cos\theta_M^0$).

[Existing Analysis]

A result of a macro-spin simulation is analyzed using an existing analysis method.

Figure 9:
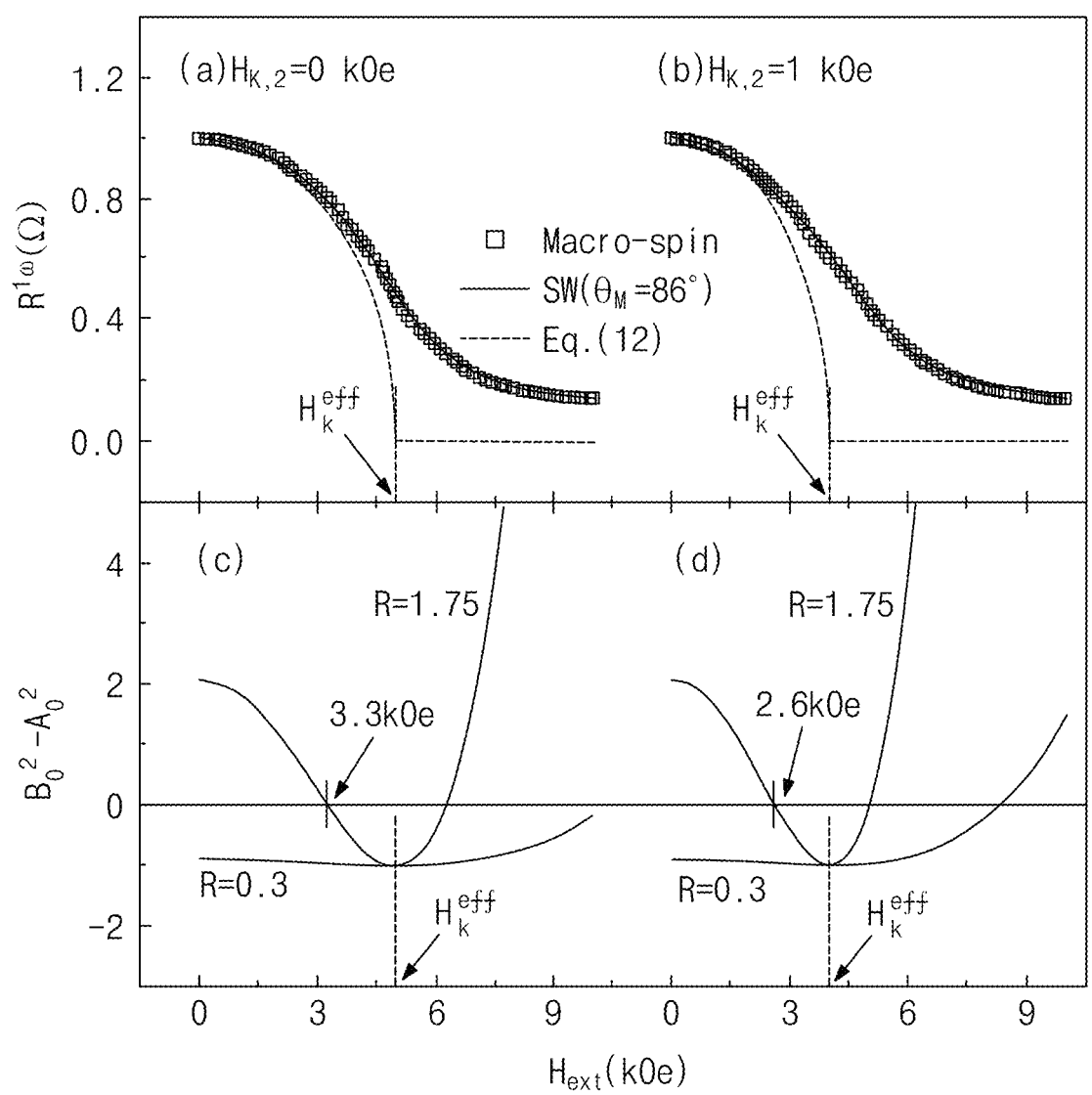
FIG. 9 includes (a) and (b) which show a result of $R^{1\omega}$ as a function of $H_{ext}$ in two systems having $H_{K,2}=0$ and $H_{K,2}=-1$ kOe.

FIG. 9 includes (a) and (b) which show a result of $R^{1\omega}$ as a function of $H_{ext}$ in two systems having $H_{K,2}=0$ and $H_{K,2}=-1$ kOe.

Results of three sets are shown in (a) and (b) in FIG. 9. A first result is obtained in a macro-spin simulation (square). A second result is obtained from a total energy equation of the Stoner-Wohlfarth model. A third result is obtained from the Equation (12) and is based on an existing analysis method (dotted line) which neglects a z-component of $H_{ext}$. A match between the result obtained in the macro-spin simulation and the result obtained from the total energy equation is perfect in the whole $H_{ext}$ range, and accuracy of the total energy equation is checked.

Since $\theta_H$ is 86 degrees, not 90 degrees, an $R^{1\omega}$ value does not converge to zero as the $H_{ext}$ increases. However, a match between the result obtained in the macro-spin simulation and a result obtained from the Equation (12) based on a conventional analysis method is excellent only in a low $H_{ext}$ range. A deviation in a high $H_{ext}$ range is actually very large and indicates limited effectiveness of an existing analysis equation.

FIG. 9 includes (c) and (d) which show a result of $B_0^2-A_0^2$ calculated from Equation (17).

$B_0^2-A_0^2$ is expressed as a function of $H_{ext}$ at two different R values. The R values are 0.3 (red curve) and 1.75 (blue curve).

A result in (c) in FIG. 9 is $H_{K,2}=0$, and a result in (d) in FIG. 9 is $H_{K,2}=-1$ kOe. $H_{Keff}$ values of the two systems are shown in the drawing. A detailed equation of $B_0^2-A_0^2$ is rewritten as follows.

$$B_0^2 - A_0^2 = R^2\left(1-\left(\frac{H_{ext}}{H_K^{eff}}\right)^2\right)^2 - 1 \qquad \text{Equation (31)}$$

$H_{ext}/H_K^{eff}$ is approximated to $\sin\theta_M^0$. It may be said that when $H_{ext}>H_K^{eff}$, a result of $B_0^2-A_0^2$ is not physically meaningful. As the $H_{ext}$ value decreases from zero to $H_K^{eff}$, a value of $B_0^2-A_0^2$ decreases from $R^2-1$ to $-1$.

The determinant $B_0^2-A_0^2$ always has a negative value at R<1. However, the determinant $B_0^2-A_0^2$ may have a positive or negative value with respect to an $H_{ext}$ range of $0-H_K^{eff}$.

This means the advent of $B_0^2-A_0^2=0$ at $H_{ext}$. This feature can be clearly seen from the results shown in (c) and (d) in FIG. 9.

In the two systems having $H_{K,2}=0$ and $H_{K,2}=-1$ kOe, a value of $B_0^2-A_0^2$ is always negative at R=0.3, is positive at R=1.75, and is finally negative after passing zero. Crossover occurs with respect to systems having $H_{K,2}=0$ and $H_{K,2}=-1$ kOe at 3.3 and 2.6 kOe, respectively. Considering $T_x=T_y=\Delta H_{DL}-\Delta H_{FL}$ when a determinant is zero, an $H_{ext}$ value should exist when R>1 and $T_x=T_y$.

Figure 10:
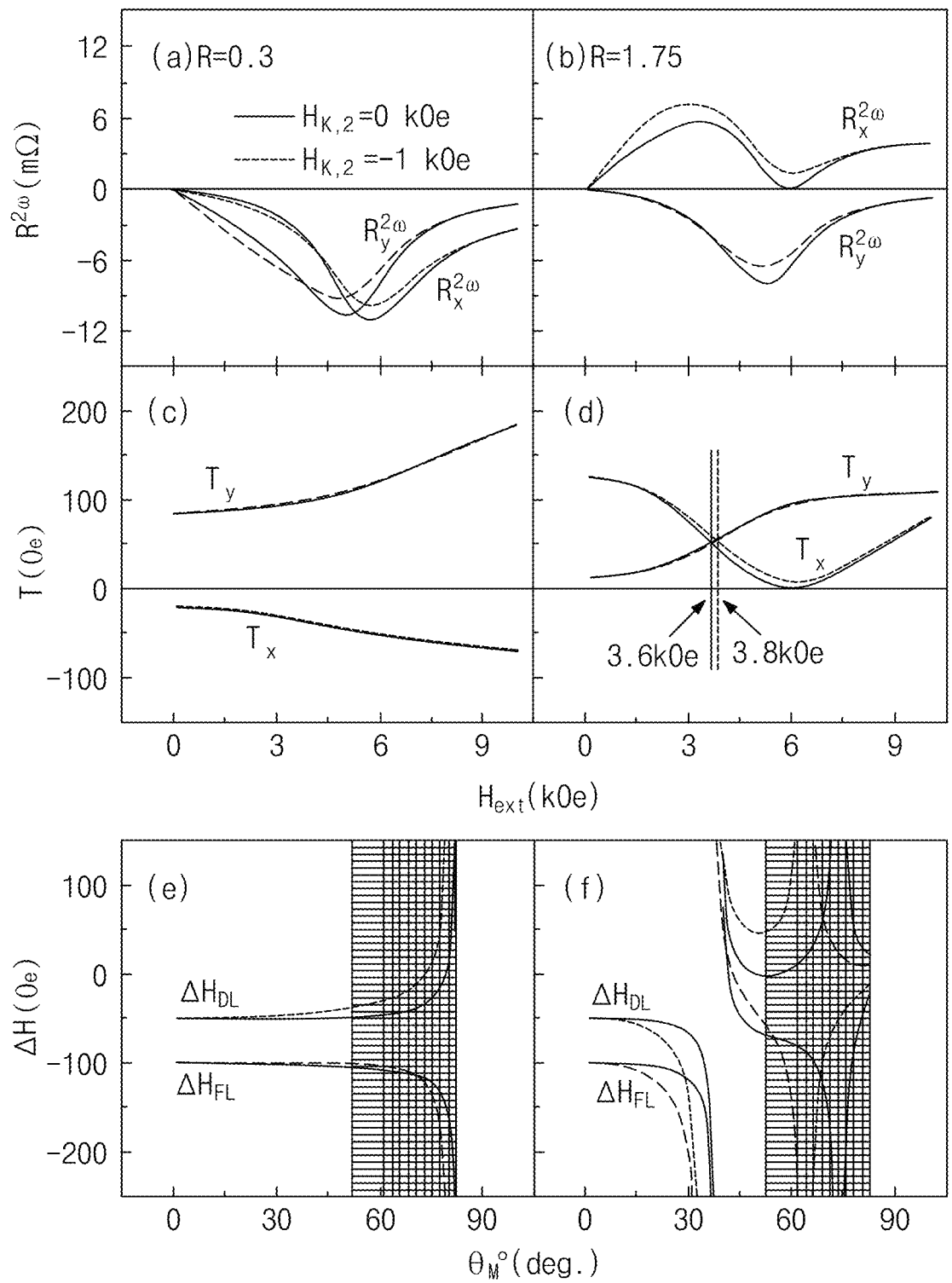
FIG. 10 includes (a) to (f) which show results of $R_x^{2\omega}$ and $R_y^{2\omega}$ [(a) and (b)] and Tx and Ty [(c) and (d)] as a function of $H_{ext}$.

FIG. 10 includes (a) to (f) which show results of $R_x^{2\omega}$ and $R_y^{2\omega}$ [(a) and (b)] and Tx and Ty [(c) and (d)] as a function of $H_{ext}$.

In FIG. 10, (e) and (f) show results of $\Delta H_{DL}$ and $\Delta H_{FL}$ as a function of $\theta_M^0$. The results are expressed with respect to two systems having $H_{K,2}=0$ (solid curve) and $H_{K,2}=-1$ kOe (dotted curve).

In FIG. 10, (a), (c), and (e) show results of R=0.3. In FIG. 10, (b), (d), and (f) show results of R=1.75. A result of $R^{2\omega}$ is obtained by a macro-spin simulation. In addition, results of Tx and Ty (Equations (15) and (16)) and results of $\Delta HDL$ and $\Delta H_{FL}$ (Equation (18)) were analytically calculated using simulation results.

Results of $R_x^{2\omega}$ and $R_y^{2\omega}$ may be described as results of $m^{1\omega}$ and $m^{2\omega}$. Only a result of a system having $H_{K,2}=0$ kOe will be described herein. A case of a system having $H_{K,2}=-1$ kOe will be discussed later. First, a relation to $R^{2\omega}$ is now described: $R^{2\omega}=R_{AHE}m_z^{2\omega}+R_{PHE}(m_x^{1\omega}m_y^{2\omega}+m_x^{2\omega}m_y^{1\omega})$. If R is negligibly small, an $R^{2\omega}$ value is in proportion to $m_z^{2\omega}$. As $H_{ext}$ increases from zero to $H_K^{eff}$, $m_z^{2\omega}$ decreases flatly. Accordingly, decrease of $R^{2\omega}$ at a small R value (R=0.3) is described. Contribution of $R_{PHE}$ to $R^{2\omega}$ increases as R increases. If a sign of $m_z^{2\omega}$ is different from signs of $m_x^{2\omega}$ and $m_y^{2\omega}$, a sign of a PHE signal is opposite to a sign of an AHE signal. This may describe a result that an absolute value of $R_y^{2\omega}$ at R=1.75 is smaller than an absolute value of $R_y^{2\omega}$ at R=0.3. A sign of $R_x^{2\omega}$ changes from a negative sign to a positive sign as R increases.

A result of $R_x^{2\omega}$ and $R_y^{2\omega}$ and a result of variation of R have a decisive effect on $T_x$ and $T_y$. Since signs of $R_x^{2\omega}$ and $R_y^{2\omega}$ are identical to each other when R=0.3, signs of $T_x$ and $T_y$ are opposite to each other. This indicates that there is no $H_{ext}$ value at which Tx=Ty in the two systems, i.e., $H_{K,2}=0$ and $H_{K,2}=-1$ kOe.

This result matches the result of $B_0^2-A_0^2$.

Values of $T_x$ and $T_y$ are equal to each other at a specific $H_{ext}$ value when $B_0^2-A_0^2=0$. Since the signs of $R_x^{2\omega}$ and $R_y^{2\omega}$ are opposite to each other at R=1.75, the signs of $T_x$ and $T_y$ are identical to each other. In both the systems having $H_{K,2}=0$ and $H_{K,2}=-1$ kOe, there is an $H_{ext}$ value at which $T_x=T_y$. However, the position is quite different from a position at which $B_0^2-A_0^2=0$. $H_{ext}$ values of the former are 3.6 kOe and 3.8 kOe in systems having $H_{K,2}=0$ kOe and $H_{K,2}=-1$ kOe, respectively. On the other hand, $H_{ext}$ values of the latter are 3.3 kOe and 2.6 kOe in systems having $H_{K,2}=0$ kOe and $H_{K,2}=-1$ kOe, respectively. This deviation occurs because a determinant does not fully reflect behavior of a first-order harmonic wave.

An inappropriate determinant, i.e., $B_0^2-A_0^2$ causes a great error in an SO effective field, as shown in (e) and (f) in FIG. 10. Since an input SO effective field is $\Delta H_{DL}=-50$ Oe and $\Delta H_{FL}=-100$ Oe, a result at R=0.3 may be significantly reliable in the range from zero degree to $\theta_M^0$ of an angle corresponding to $H_{ext}=H_K^{eff}$. This angle is 61 degrees in $H_{K,2}=0$ kOe and is 52 degrees in $H_{K,2}=-1$ kOe. An output SO effective field starts to deviate from an input value over these two angles shown as a vertical line and a horizontal line. A shown area ends at 82 degrees or less, not 90 degrees. This is because an m vector is not completely aligned along x-axis or y-axis even at $H_{ext}=10$ kOe. The output SO effective field exhibits a divergence, which is not physically meaningful at $\theta_M^0=\sim 81$ degrees ($H_{K,2}=0$ kOe).

A deviation is very large when R=1.75. In the case of the system having $H_{K,2}=0$ kOe, a divergence occurs at 37 degrees or less. In the system having $H_{K,2}=-1$ kOe, a similar behavior is observed and a divergence occurs at 32 degrees or less. The divergence is caused by mislocation of the $H_{ext}$ value when $B_0^2-A_0^2=0$. Occurrence of an additional divergence significantly limits reliability of a conventional analysis method for the two systems, i.e., $H_{K,2}=0$ kOe and $H_{K,2}=-1$ kOe.

C. Analysis of the Present Disclosure

An unreliable result is obtained in a conventional analysis, which is mainly due to a determinant that does not properly describe the behavior of a first-order harmonic wave. For an accurate assessment of the determinant, a new analysis is started by deciding a relationship between $\theta_M^0$ and $H_{ext}$. It may be obtained using $\theta_M^0=\cos^{-1}(R^{1\omega}/R_{AHE})$ or a total energy equation.

As a function of $H_{ext}$ calculated using a total energy equation for the systems having $H_{K,2}=0$ kOe and $H_{K,2}=-1$ kOe, a result of $R^{1\omega}$ may be used to obtain the relationship.

Figure 11:
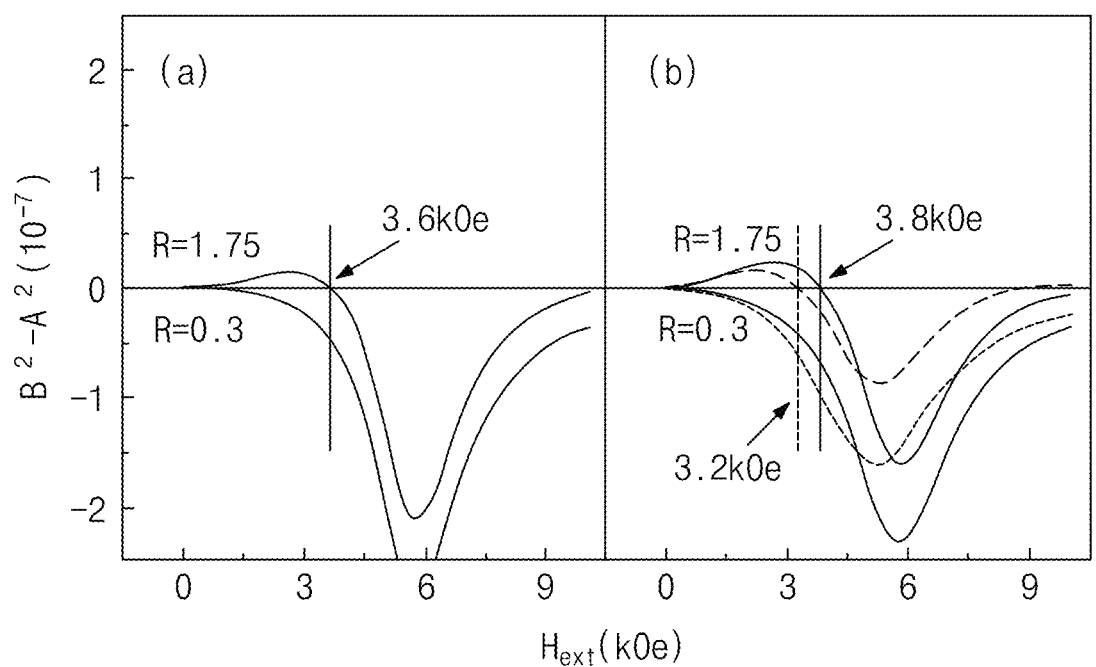
FIG. 11 includes (a) and (b) which show results of a determinant $B^2-A^2$ as a function of $H_{ext}$ obtained from a new analysis with respect to a system having $H_{K,2}=0$ and $-1$ kOe.

FIG. 11 includes (a) and (b) which show results of a determinant $B^2-A^2$ as a function of $H_{ext}$ obtained from a new analysis with respect to a system having $H_{K,2}=0$ and $-1$ kOe.

A behavior of $R^{1\omega}$ is induced using a relationship between $\theta_M^0$ and $H_{ext}$ At R=1.75, an $H_{ext}$ value where $B^2-A^2=0$ is 3.6 kOe and 3.8 kOe in the systems having $H_{K,2}=0$ and $H_{K,2}=-1$ kOe, respectively. The $H_{ext}$ value is equal to the value obtained from $T_x=T_y$.

However, the $H_{ext}$ value is considerably different from values of 3.3 kOe and 2.6 kOe obtained using an existing analysis. To verify importance of including $H_{K,2}$, a determinant was calculated by neglecting $H_{K,2}$. These results are also shown in (b) in FIG. 11 (dotted curves).

A difference between two cases R=0.3 and R=1.75 is very great, which indicates that $H_{K,2}$ is considered in analysis. For example, an $H_{ext}$ value where a determinant is zero at R=1.75 is mislocated from 3.8 kOe to 3.2 kOe when the $H_{K,2}$ is neglected. In addition, a new location indicating a zero value of the dominant appears at $H_{ext}=9.0$ kOe.

Figure 12:
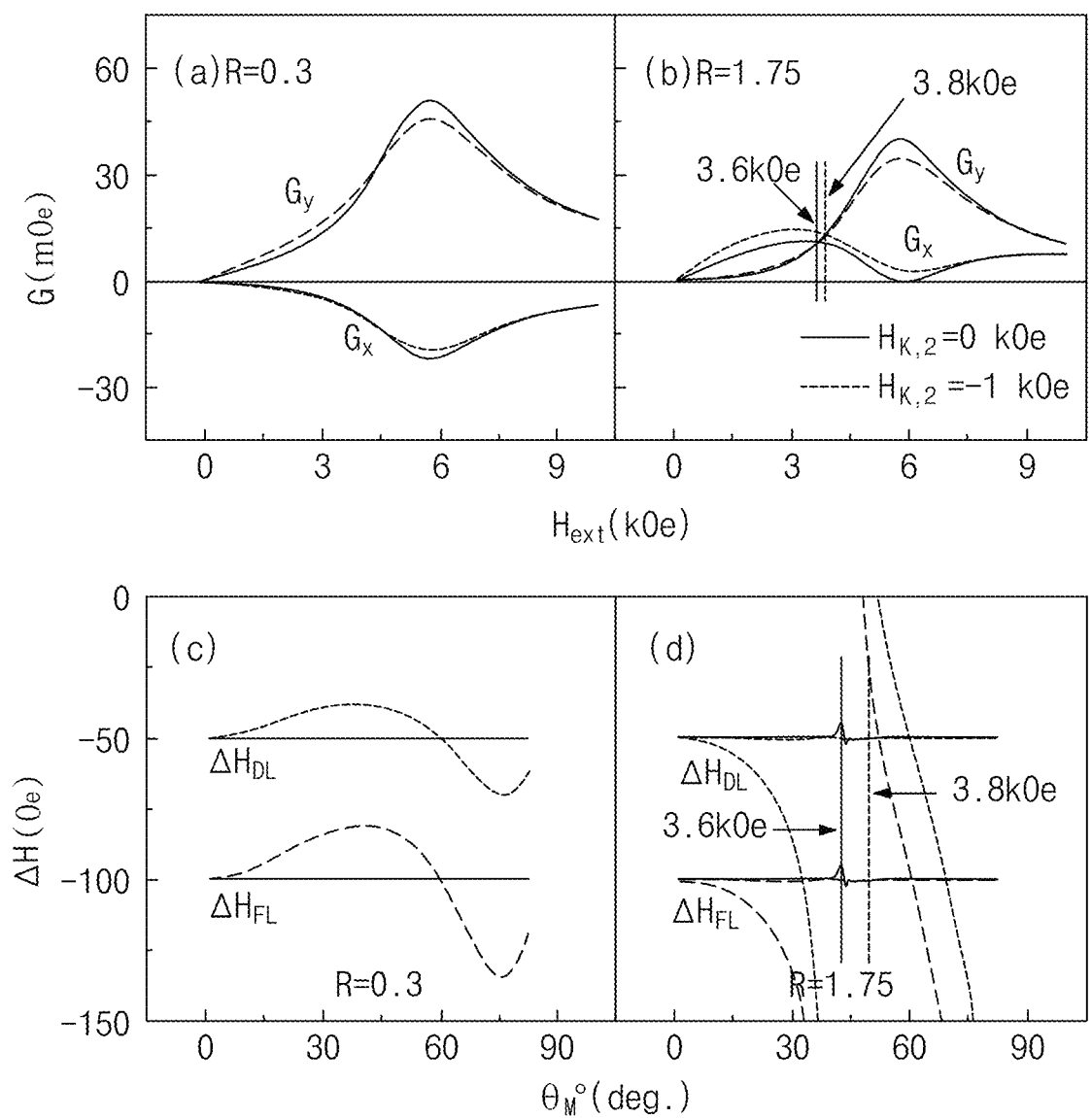
FIG. 12 includes (a) and (b) which show results of $G_x$ and $G_y$ corresponding to $T_x$ and $T_y$ in an existing analysis at $R=0.3$ and 1.75, respectively.

FIG. 12 includes (a) and (b) which show results of $G_x$ and $G_y$ corresponding to $T_x$ and $T_y$ in an existing analysis at R=0.3 and 1.75, respectively.

The results are shown in systems having $H_{K,2}$=0 kOe (solid curve) and $H_{K,2}$=−1 kOe (broken curve), respectively. $H_{ext}$ values at $G_x$=$G_y$ are 3.6 kOe and 3.8 kOe with respect to the systems having $H_{K,2}$=0 kOe and $H_{K,2}$=−1 kOe, respectively. The $H_{ext}$ value is equal to a value where $B^2-A^2$=0. This is in contrast to a case of conventional analysis. In the conventional analysis, an $H_{ext}$ value where a determinant is zero is substantially different from a value where $T_x$=$T_y$.

In the case of having a new result set for a determinant and a G ratio, it is simple to calculate an SO effective field.

FIG. 12 includes (c) and (d) in which results of $\Delta H_{DL}$ and $\Delta H_{FL}$, as a function of $\theta_M^0$, are shown with respect to R=0.3 and 1.75.

Two sets of results are shown. The two sets of results are shown on two systems having $H_{K,2}$=0 (solid curve) and $H_{K,2}$=−1 kOe (broken curve), respectively. The (c) and (d) in FIG. 12 shows that in the two systems, calculated values of $\Delta H_{DL}$ and $\Delta H_{FL}$ well match an input value (the whole $\theta_M^0$ range from zero degree to 82 degrees) used in the macro-spin simulation. This demonstrates reliability of a new analysis. In particular, at R=0.3, a solid curve for the system having $H_{K,2}$=0 kOe completely overlaps a dotted curve for the system having $H_{K,2}$=−1 kOe. Accordingly, there is a perfect match with respect to the two systems.

A similar behavior was observed at R=1.75. Only one difference is that at $B^2-A^2$=0, small peaks were observed at 43 degrees or less and 50 degrees or less in the system having $H_{K,2}$=0 kOe and the system having $H_{K,2}$=−1 kOe, respectively.

In a system having both $H_{K,1}^{eff}$ and $H_{K,2}$, a determinant $B^2-A^2$ is considerably different when $H_{K,2}$ is neglected. A similar difference is expected at calculated values of $\Delta H_{DL}$ and $\Delta H_{FL}$ using the Equations (21) and (22). The $\Delta H_{DL}$ and $\Delta H_{FL}$ are shown in (c) and (d) in FIG. 13 (dotted curves).

R=0.3, absolute values of $\Delta H_{DL}$ and $\Delta H_{FL}$ are underestimated in the range from zero degrees to 60 degrees and are overestimated in the range from 60 degrees to 82 degrees. This would be understood from an $H_{K,2}$ term. This is in proportion to $\sin\theta_M^0 \sin 3\theta_M^0$ (Equation (26)).

At R=1.75, the difference increases somewhat and there are two divergences of 39 degrees or less and 80 degrees or less.

This is because of a mislocated $H_{ext}$ field of 3.2 kOe and 9.0 kOe where $B^2-A^2$=0. This result shows that in the system having both $H_{K,1}^{eff}$ and $H_{K,2}$, $H_{K,2}$ should not be neglected in analysis of a harmonic measurement result.

D. Comparison Between Existing and New Analyses of Wide R Range

Until now, two typical R ratios of 0.3 and 1.75 have been considered. To test a new analysis method of a wide R range, a study was conducted more systemically by gradually changing the R ratio from zero to 2 at 0.05 with respect to the system having $H_{K,2}$=−1 kOe.

Figure 13:
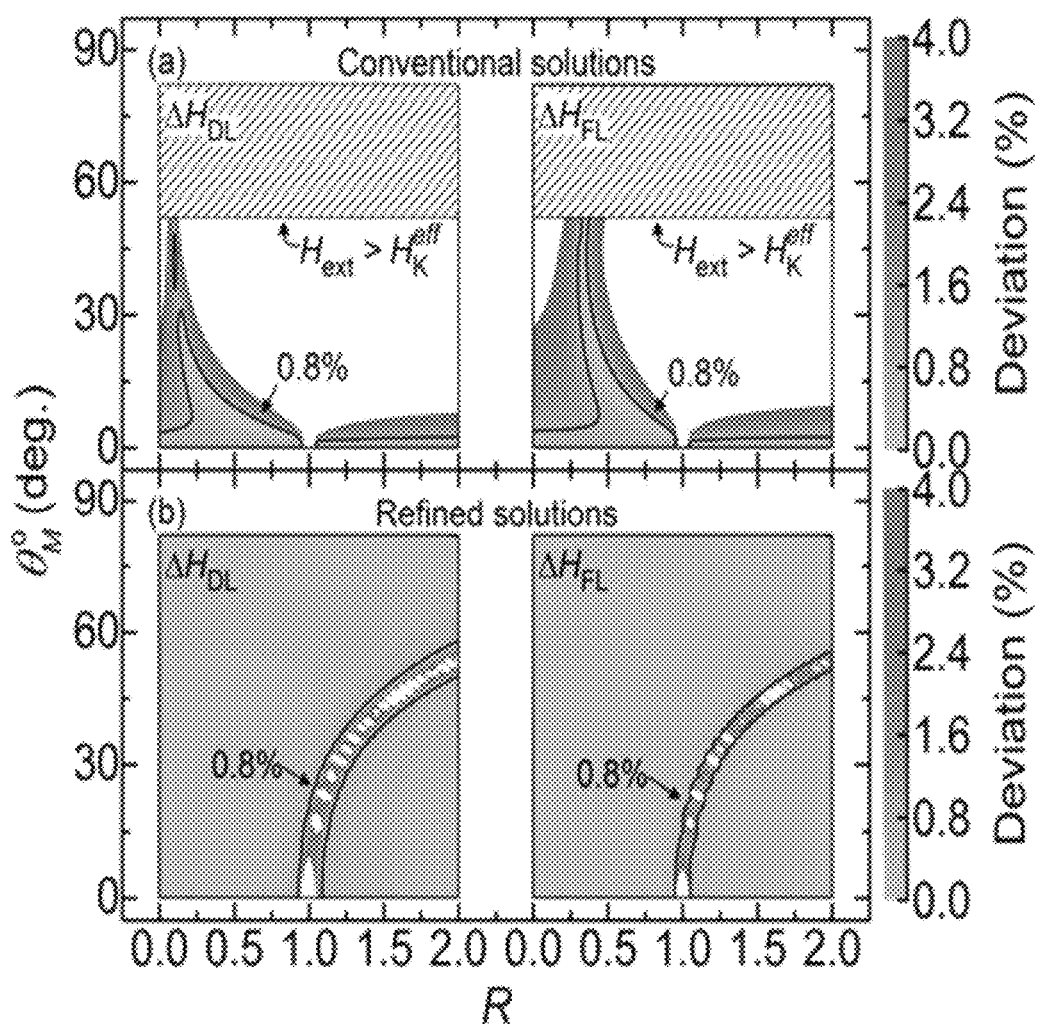
FIG. 13 includes (a) and (b) which are contour plots showing deviations (unit: %) of input values of $\Delta H_{DL}$ (left panel) and $\Delta H_{FL}$ (right panel) as functions of $\theta_M^0$ and R.

FIG. 13 includes (a) and (b) which are contour plots showing deviations (unit: %) of input values of $\Delta H_{DL}$ (left panel) and $\Delta H_{FL}$ (right panel) as functions of $\theta_M^0$ and R.

A result calculated by an existing interpretation method is shown in (a) in FIG. 13, and a result calculated by a new method is shown in (b) in FIG. 13. In the case of a conventional analysis equation, when $H_{ext}$>$H_{Keff}$, a physically meaningless $\theta_M^0$ range is shown in (a) in FIG. 13 as a slope line. In (a) and (b) in FIG. 13, each solid curve indicates a deviation of 0.8 percent and each white area indicates a deviation of 4 percent or more.

From (a) in FIG. 13, a conventional solution is effective to $\theta_M^0$ and R of a limited range. For example, an R range having a device of 4 percent or less is 0.06 to 0.12 in the case of $\Delta H_{DL}$ and is 0.21 to 0.46 in the case of $\Delta H_{FL}$ in the $\theta_M^0$ range of zero to 52 degrees. At an R value higher than 1.1, an effective range is much more limited to both $\Delta H_{DL}$ and $\Delta H_{FL}$. More specifically, a $\theta_M^0$ value where a deviation to $\Delta H_{DL}$ is 4 percent or less is 4.5 degrees at R=1.1 and is 7.9 degrees at R=2.0. Additionally, a $\theta_M^0$ value where a deviation to $\Delta H_{FL}$ is 4 percent or less is 4.5 degrees at R=1.1 and is 9.4 degrees at R=2.0.

In an intermediate R range from 0.9 to 1.1, a deviation is always greater than 4 percent. Accuracy of a calculated result is significantly improved by using the new method.

If a z-component of $H_{ext}$ is considered in the new analysis, there is no area in which a physical importance does not exist. In addition, the content estimated in the new analysis is very accurate. At R<0.85, a deviation to both $\Delta H_{DL}$ and $\Delta H_{FL}$ is less than 0.4 percent in the whole $\theta_M^0$ range from zero to 82 degrees. At R>0.85, a deviation to both $\Delta H_{DL}$ and $\Delta H_{FL}$ is 0.8 percent or less throughout the whole range except for an area represented by solid curves. In the area represented by the solid curves, the deviation is somewhat large due to the existence of divergence.

A test of an existing analysis method for analyzing a macro-spin simulation result indicates that its effective range is very limited in the context of $\theta_M^0$ and R. This is mainly caused by a singularity associated with Cramer's rule at a wrong $\theta_M^0$ value. This problem may be overcome by a new analysis method proposed in the present disclosure as a new analysis equation considering both a z-component of $H_{ext}$ and a second-order PMA.

An SO effective field extracted using a new analysis method matches well an input SO effective field used in a macro-spin simulation in the whole $\theta_M^0$ range and a wide R range from zero to 2. In particular, at R<0.85, a deviation to from an input effective field is 0.4 percent or less in both $\Delta H_{DL}$ and $\Delta H_{FL}$ with respect to the whole $\theta_M^0$ range from zero to 82 degrees. At R>0.85, a deviation is 0.8 percent or less in both $\Delta H_{DL}$ and $\Delta H_{FL}$ with respect to the while area except for some limited areas having a singularity. If a harmonic Hall voltage measurement result is accurately analyzed by a new analysis method for a wide range of $\theta_M^0$ and R, a large contribution may be made to confirm a dominant mechanism of SOT and develop a high-efficiency SOT device.

According to an example embodiment of the present disclosure, there is provided an accurate harmonic Hall voltage analysis method with a detailed analysis equation considering both a z-component of an applied magnetic field and second-order perpendicular magnetic anisotropy. A spin-orbit effective field extracted suing the new analysis method showed an excellent match with a spin-orbit effective field used in a macro-spin simulation over the whole range of a polar magnetization angle and a resistance ratio of an anomalous Hall resistance to a plane Hall resistance of a wide range.

Although the present disclosure and its advantages have been described in detail, it should be understood that various changes, substitutions and alterations can be made herein without departing from the spirit and scope of the disclosure as defined by the following claims.

What is claimed is:

1. A harmonic Hall voltage analysis method comprising:

measuring a first Hall voltage signal Vx while applying in-plane alternating current (AC) of a sine wave having a basic angular frequency ω in a first direction (x direction) in which a sample including a nonmagnetic layer/magnetic layer extends according to a first external magnetic field $H_{ext,xz}$;

measuring a second Hall voltage signal Vy while applying the in-plane AC of the sine wave having the basic angular frequency ω in the first direction (x direction) in which the sample extends according to a second external magnetic field $H_{ext,yz}$;

measuring a third Hall voltage signal Vxy while applying the in-plane AC of the sine wave having the basic angular frequency ω in the first direction (x direction) in which the sample extends according to a third external magnetic field $H_{ext,xy}$;

extracting a first harmonic Hall resistance component $R^{1\omega}_x$ of the first external magnetic field $H_{ext,xz}$ and a second harmonic Hall resistance component $R^{2\omega}_x$ of the first external magnetic field $H_{ext,xz}$ by using the first Hall voltage signal Vx;

extracting a first harmonic Hall resistance component $R^{1\omega}_y$ of the second external magnetic field $H_{ext,yz}$ and a second harmonic Hall resistance component $R^{2\omega}_y$ of the second external magnetic field $H_{ext,yz}$ by using the second Hall voltage signal Vy;

extracting a first harmonic Hall resistance component $R^{1\omega}_{xy}$ of the third external magnetic field $H_{ext,xy}$ by using the second Hall voltage signal Vxy;

extracting an anomalous Hall effect resistance $R_{AHE}$ by using the first harmonic Hall resistance component $R^{1\omega}_x$ of the first external magnetic field $H_{ext,xz}$ according to the first external magnetic field $H_{ext,xz}$ or the first harmonic Hall resistance component $R^{1\omega}_y$ of the second external magnetic field $H_{ext,yz}$ according to the second external magnetic field $H_{ext,yz}$;

extracting a planar Hall resistance $R_{PHE}$ by using the first harmonic Hall resistance component $R^{1\omega}_{xy}$ of the third external magnetic field $H_{ext,xy}$;

extracting a first resistance ratio ($G_x = 2R^{2\omega}_x/R_{AHE}$) of the second harmonic Hall resistance component $R^{2\omega}_x$ of the first external magnetic field $H_{ext,xz}$ to the anomalous Hall effect resistance $R_{AHE}$ and a second resistance ratio ($G_y = -2R^{2\omega}_y/R^{1\omega}_y$) of the second harmonic Hall resistance component $R^{2\omega}_y$ of the second external magnetic field $H_{ext,yz}$ to the first harmonic Hall resistance component $R^{1\omega}_y$ of the second external magnetic field $H_{ext,yz}$, respectively; and converting the first resistance ratio $G_x$ and the second resistance ratio $G_y$ into a damping-like effective field $\Delta H_{DL}$ and a field-like effective field $\Delta H_{FL}$, wherein:

the first external magnetic field $H_{ext,xz}$ maintains a constant direction in an xy plane defined by the first direction and a third direction perpendicular to a disposition plane and varies in magnitude, the second external magnetic field $H_{ext,yz}$ has the same maximum magnitude as the first external magnetic field $H_{ext,xz}$, maintains a constant direction in a yz plane defined by the second direction and the third direction perpendicular to the disposition plane, and varies in magnitude, and the third external magnetic field $H_{ext,xy}$ maintains a constant magnitude on the disposition plane and varies in direction.

2. The harmonic Hall voltage analysis method of claim 1, wherein:

in a spherical coordinate system indicating a magnetization direction of the magnetic layer of the sample, values of a polar angle $\theta_M$ and an azimuthal angle $\varphi_M$ vibrate to $\theta_M(t) = \theta_M^0 + \Delta\theta_M \sin \omega t$ and $\varphi_M(t) = \varphi_M^0 + \Delta\varphi_M \sin \omega t$, where an equilibrium polar angle $\theta_M^0$ and an equilibrium azimuthal angle $\varphi_M^0$ indicate the values of the polar angle $\theta_M$ and the azimuthal angle $\varphi_M$ when there is no in-plane alternating current, and $\Delta\theta_M$ and $\Delta\varphi_M$ are as follows:

$$\Delta\theta_M = -\frac{\Delta H_{DL}\cos\phi_H + \Delta H_{FL}\cos\theta_M^0 \sin\phi_H}{H_K^{eff}\cos 2\theta_M^0 + H_{ext}\cos(\theta_M^0 - \theta_H)}$$

$$\Delta\phi_M = \frac{\Delta H_{DL}\cos\theta_M^0 \sin\phi_H - \Delta H_{FL}\cos\phi_H}{H_{ext}\sin\theta_H}$$

where $H_{ext}$ represents a corresponding value at the equilibrium polar angle $\theta_M^0$ in a first external magnetic field, $\theta_H$ and $\varphi_H$ represent a polar angle and an azimuthal angle of the first external magnetic field or a second external magnetic field, respectively, and $H_K^{eff}$ represents an effective PMA magnetic field.

3. The harmonic Hall voltage analysis method of claim 2, wherein:

a damping-like effective field $\Delta H_{DL}$ and a field-like effective field $\Delta H_{FL}$ are as follows:

$$\begin{pmatrix} \Delta H_{DL} \\ \Delta H_{FL} \end{pmatrix} = \frac{1}{B_1^2 - A_1^2} \begin{pmatrix} -A_1 & B_1 \\ -B_1 & A_1 \end{pmatrix} \begin{pmatrix} G_x \\ G_y \end{pmatrix}$$

$$A_1 \equiv \frac{\sin\theta_M^0}{H_K^{eff}\cos 2\theta_M^0 + H_{ext}\cos(\theta_M^0 - \theta_H)}$$

$$B_1 \equiv \frac{R\sin^2\theta_M^0}{H_{ext}\sin\theta_H}$$

4. The harmonic Hall voltage analysis method of claim 1, wherein:

in a spherical coordinate system indicating a magnetization direction of the magnetic layer of the sample, values of a polar angle $\theta_M$ and an azimuthal angle $\varphi_M$ vibrate to $\theta_M(t) = \theta_M^0 + \Delta\theta_M \sin \omega t$ and $\varphi_M(t) = \varphi_M^0 + \Delta\varphi_M \sin \omega t$, where an equilibrium polar angle $\theta_M^0$ and an equilibrium azimuthal angle $\varphi_M^0$ indicate the values of the polar angle $\theta_M$ and the azimuthal angle $\varphi_M$ when there is no in-plane alternating current, and $\Delta\theta_M$ and $\Delta\varphi_M$ are as follows:

$$\Delta\theta = -\frac{\Delta H_{DL}\cos\phi_H + \Delta H_{FL}\cos\theta_M^0 \sin\phi_H}{H_K^{eff}\cos 2\theta_M^0 - H_{K,2}\sin\theta_M^0 \sin 3\theta_M^0 + H_{ext}\cos(\theta_M^0 - \theta_H)}$$

$$\Delta\phi_M = \frac{\Delta H_{DL}\cos\theta_M^0 \sin\phi_H - \Delta H_{FL}\cos\phi_H}{H_{ext}\sin\theta_H}$$

where $H_{ext}$ represents a corresponding value at the equilibrium polar angle $\theta_M^0$ in a first external magnetic field, $\theta_H$ and $\varphi_H$ represent a polar angle and an azimuthal angle of the first external magnetic field or a second external magnetic field, respectively, $H^{eff}_K$ represents an effective PMA magnetic field, and $H_{K,2}$ represents a second-order PMA magnetic field.

5. The harmonic Hall voltage analysis method of claim 4, wherein:

a damping-like effective field $\Delta H_{DL}$ and a field-like effective field $\Delta H_{FL}$ are as follows:

$$\begin{pmatrix} \Delta H_{DL} \\ \Delta H_{FL} \end{pmatrix} = \frac{1}{B_2^2 - A_2^2} \begin{pmatrix} -A_2 & B_2 \\ -B_2 & A_2 \end{pmatrix} \begin{pmatrix} G_x \\ G_y \end{pmatrix}$$

$$A_2 \equiv \frac{\sin\theta_M^0}{H_K^{eff}\cos 2\theta_M^0 - H_{K,2}\sin\theta_M^0 \sin 3\theta_M^0 + H_{ext}\cos(\theta_M^0 - \theta_H)}$$

-continued $$B_2 \equiv \frac{R\sin^2\theta_M^0}{H_{ext}\sin\theta_H}$$

6. The harmonic Hall voltage analysis method of claim 4, further comprising:

calculating the equilibrium polar angle $\theta_M^0$ is calculated as follows:

$\theta_M^0 = \cos^{-1}(R_x^{1\omega}/R_{AHE})$; and extracting a first-order effective PMA magnetic field $H_{k,1}^{eff}$ and a second-order PMA magnetic field $H_{K,2}$ by using a generalized-Sucksmith-Thompson (GST) method and calculating an effective PMA magnetic field $H^{eff}_K$ by arithmetically operating the first-order effective PMA magnetic field $H_{k,1}^{eff}$ and the second-order PMA magnetic field $H_{K,2}$.

* * * * *